(12) United States Patent
Kim et al.

(10) Patent No.: US 10,192,620 B2
(45) Date of Patent: Jan. 29, 2019

(54) NONVOLATILE MEMORY DEVICE, OPERATING METHOD OF NONVOLATILE MEMORY DEVICE, AND STORAGE DEVICE INCLUDING NONVOLATILE MEMORY DEVICE

(71) Applicant: SAMSUNG ELECTRONICS CO., LTD., Suwon-si, Gyeonggi-do (KR)

(72) Inventors: Wandong Kim, Seoul (KR); Sang-Soo Park, Hwaseong-si (KR); Se Hwan Park, Yongin-si (KR); Sang-Wan Nam, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/816,903

(22) Filed: Nov. 17, 2017

(65) Prior Publication Data

US 2018/0204620 A1   Jul. 19, 2018

(30) Foreign Application Priority Data

Jan. 18, 2017   (KR) .................. 10-2017-0008782

(51) Int. Cl.
*G11C 16/04* (2006.01)
*G11C 16/08* (2006.01)

(52) U.S. Cl.
CPC .......... *G11C 16/08* (2013.01); *G11C 16/0483* (2013.01)

(58) Field of Classification Search
CPC ................ G11C 16/08; G11C 16/0483
USPC ........................................ 365/185.12, 203
See application file for complete search history.

(56) References Cited

U.S. PATENT DOCUMENTS

| | | | |
|---|---|---|---|
| 5,963,475 A * | 10/1999 | Choi | G11C 8/12 |
| | | | 365/185.11 |
| 6,201,731 B1 | 3/2001 | Kamp et al. | |
| 7,286,412 B1 * | 10/2007 | Chen | G11C 16/3418 |
| | | | 365/185.24 |
| 7,554,848 B2 | 6/2009 | Li et al. | |
| 7,692,961 B2 | 4/2010 | Eitan et al. | |
| 7,889,558 B2 | 2/2011 | Kanda | |
| 8,018,777 B2 | 9/2011 | Kang | |
| 8,289,778 B2 | 10/2012 | Soma | |
| 9,465,537 B2 | 10/2016 | Nishikubo et al. | |
| 2016/0170643 A1 | 6/2016 | Katsurayama et al. | |

* cited by examiner

*Primary Examiner* — Vu Le
(74) *Attorney, Agent, or Firm* — Volentine, Whitt & Francos, PLLC

(57) ABSTRACT

A nonvolatile memory device performs a method which includes: causing a ready/busy signal pin of the nonvolatile memory device to indicate that the nonvolatile memory device is in a precharge busy state wherein the nonvolatile memory device is not available to perform memory access operations for its nonvolatile memory cells; applying one or more word line precharge voltages to one or more selected word lines among a plurality of word lines of the nonvolatile memory device to precharge the selected word lines; and, after at least a portion of the precharge operation, causing the ready/busy signal pin to transition from indicating the precharge busy state, to indicating that the nonvolatile memory device is in a ready state wherein the nonvolatile memory device is available to perform memory access operations for its nonvolatile memory cells.

19 Claims, 21 Drawing Sheets

NONVOLATILE MEMORY DEVICE, OPERATING METHOD OF NONVOLATILE MEMORY DEVICE, AND STORAGE DEVICE INCLUDING NONVOLATILE MEMORY DEVICE

CROSS-REFERENCE TO RELATION APPLICATION

This application claims the benefit of Korean Patent Application No. 10-2017-0008782, filed on Jan. 18, 2017, in the Korean Intellectual Property Office, the disclosure of which is incorporated herein in its entirety by reference.

BACKGROUND

Embodiments of the inventive concept disclosed herein relate to a semiconductor circuit, and more particularly, to a nonvolatile memory device, an operating method of the nonvolatile memory device, and a storage device including the nonvolatile memory device.

A storage device refers to a device, which stores data under control of a host device, such as a computer, a smartphone, and a smart pad. The storage device includes a device, which stores data on a magnetic disk, such as a hard disk drive (HDD), or a device, which stores data on a semiconductor memory, in particular, a nonvolatile memory, such as a solid state drive (SSD) or a memory card.

The nonvolatile memory includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), etc.

The degree of integration of the storage device and a volume thereof continue to increase as semiconductor manufacturing technologies develop. The high degree of integration of the storage device makes it possible to reduce costs needed to manufacture the storage device. However, the high degree of integration of the storage device causes scale-down and a structure change of the storage device, and thus various new problems occur. Such problems cause a damage of data stored in the storage device, thereby lowering the reliability of the storage device. There is a need for a method and a device capable of improving the reliability of the storage device.

SUMMARY

Embodiments of the inventive concept provide a nonvolatile memory device with improved reliability, an operating method of the nonvolatile memory device, and a storage device including the nonvolatile memory device.

In one aspect, a nonvolatile memory device comprises: a memory cell array including a plurality of nonvolatile memory cells configured to store data therein, wherein each of the nonvolatile memory cells is connected to one of a plurality of word lines and one of a plurality of bit lines of the memory cell array; a row decoder connected to the word lines and configured to selectively apply at least one word line voltage to at least one of the word lines; a page buffer connected to the plurality of bit lines; and a ready/busy signal pin. The nonvolatile memory device is configured to perform a word line precharge operation by: causing the ready/busy signal pin to indicate that the nonvolatile memory device is in a precharge busy state wherein the nonvolatile memory device is not available to perform memory access operations for the nonvolatile memory cells; applying one or more word line precharge voltages to one or more selected word lines among the plurality of word lines to precharge the selected word lines; and after at least a portion of the word line precharge operation, cause the ready/busy signal pin to transition from indicating the precharge busy state, to indicating that the nonvolatile memory device is in a ready state wherein the memory device is available to perform memory access operations for the nonvolatile memory cells.

In another aspect, a nonvolatile memory system comprises: a nonvolatile memory device having a memory cell array including a plurality of nonvolatile memory cells configured to store data therein, wherein each of the nonvolatile memory cells is connected to one of a plurality of word lines and one of a plurality of bit lines of the memory cell array, wherein the nonvolatile memory device includes a ready/busy signal pin; and a memory controller configured to control operations of the nonvolatile memory device. The nonvolatile memory system is configured to perform a word line precharge operation by: causing the ready/busy signal pin to indicate that the nonvolatile memory device is in a precharge busy state wherein the nonvolatile memory device is not available to perform memory access operations for the nonvolatile memory cells; applying one or more word line precharge voltages to one or more selected word lines among the plurality of word lines to precharge the selected word lines; and, after at least a portion of the word line precharge operation, cause the ready/busy signal pin to transition from indicating the precharge busy state, to indicating that the nonvolatile memory device is in a ready state wherein the nonvolatile memory device is available to perform memory access operations for the nonvolatile memory cells.

In yet another aspect, a method is provided for performing a precharge operation for a nonvolatile memory device having a memory cell array including a plurality of nonvolatile memory cells configured to store data therein, wherein each of the nonvolatile memory cells is connected to one of a plurality of word lines and one of a plurality of bit lines of the memory cell array. The method comprises: causing a ready/busy signal pin of the nonvolatile memory device to indicate that the nonvolatile memory device is in a precharge busy state wherein the nonvolatile memory device is not available to perform memory access operations for the nonvolatile memory cells; applying one or more word line precharge voltages to one or more selected word lines among the plurality of word lines to precharge the selected word lines; and after at least a portion of the precharge operation, causing the ready/busy signal pin to transition from indicating the precharge busy state, to indicating that the nonvolatile memory device is in a ready state wherein the nonvolatile memory device is available to perform memory access operations for the nonvolatile memory cells.

In still another aspect, a memory controller comprises: a nonvolatile memory device interface for communicating with a nonvolatile memory device having at least one word line; and a precharge control block configured to determine when the nonvolatile memory device should perform a precharge operation, and further configured to cause the memory controller to send a command to the nonvolatile memory device via the nonvolatile memory device interface, wherein the command causes the nonvolatile memory device to perform the precharge operation, wherein in the precharge operation the nonvolatile memory device precharges the at least one word line of the nonvolatile memory device with a precharge voltage.

BRIEF DESCRIPTION OF THE FIGURES

The above and other objects and features will become apparent from the following description with reference to the following figures, wherein like reference numerals refer to like parts throughout the various figures unless otherwise specified

FIG. 16 illustrates another example in which the controller issues the precharge command in response to power on.

DETAILED DESCRIPTION

Below, embodiments will be described clearly and in detail with reference to accompanying drawings.

As is traditional in the field of the inventive concepts, one or more elements of embodiments may be described and illustrated in terms of functional blocks, units and/or modules. These blocks, units and/or modules are physically implemented by electronic circuits such as logic circuits, microprocessors, hard-wired circuits or the like, and may optionally be driven by firmware and/or software. Also, each functional block, unit and/or module of the embodiments may be physically separated into two or more interacting and discrete blocks, units and/or modules without departing from the scope of the inventive concepts. Further, two or more of the functional blocks, units and/or modules of the embodiments may be physically combined into more complex blocks or units without departing from the scope of the inventive concepts.

Figure 1:
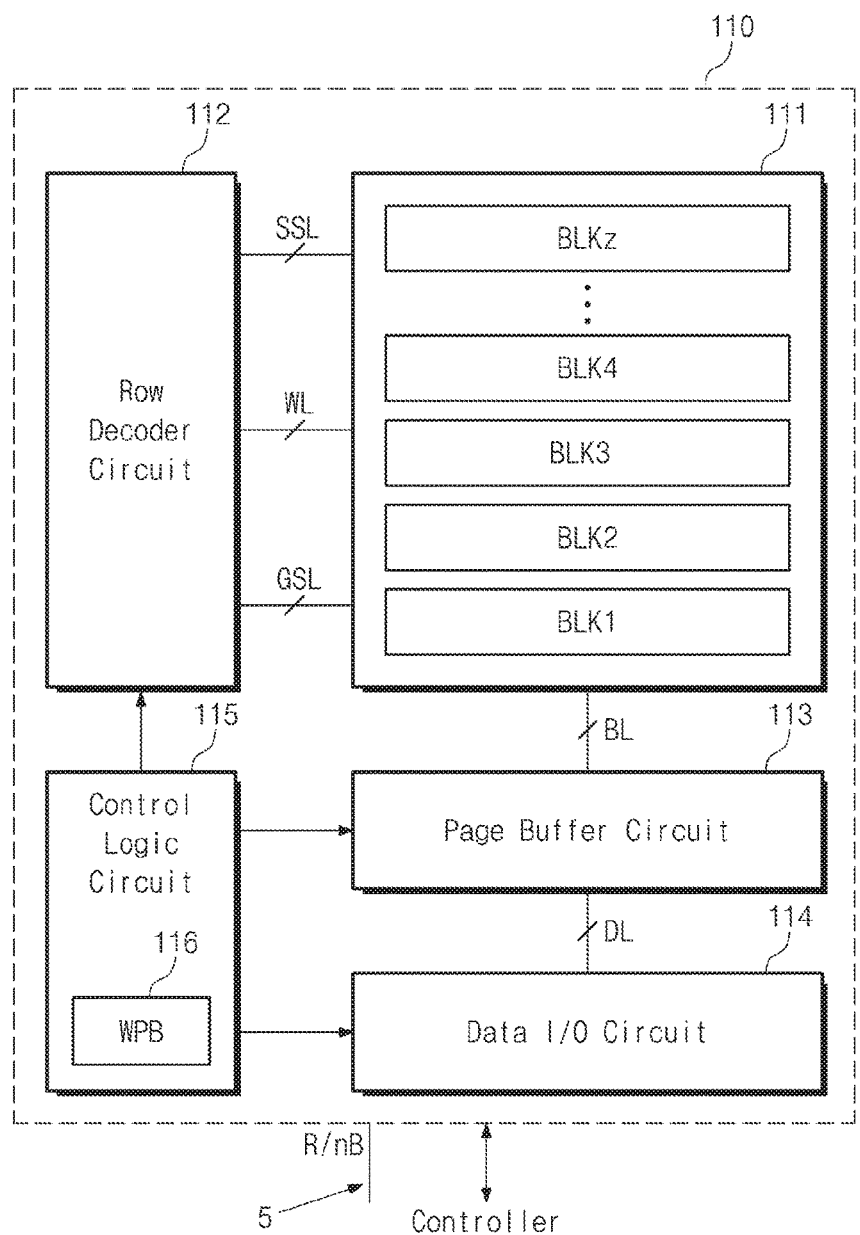
FIG. 1 is a block diagram illustrating an embodiment of a nonvolatile memory device.

FIG. 1 is a block diagram illustrating an embodiment of a nonvolatile memory device 110. Referring to FIG. 1, nonvolatile memory device 110 may include a memory cell array 111, a row decoder circuit 112, a page buffer circuit 113, a data input/output circuit 114, and a control logic circuit 115. Nonvolatile memory device 110 communicates with a memory controller over one or more buses (e.g., a data bus, an address bus, a command bus, etc.) including a ready/busy (R/nB) signal pin 5 which will be described in greater detail below.

Memory cell array 111 includes a plurality of memory blocks BLK1 to BLKz. Each of the memory blocks BLK1 to BLKz includes a plurality of memory cells. Each of the memory blocks BLK1 to BLKz may be connected to row decoder circuit 112 through one or more ground selection lines GSL, a plurality of word lines WL, a plurality of dummy word lines DWL, and one or more string selection lines SSL. Each of the memory blocks BLK1 to BLKz may be connected to page buffer circuit 113 through a plurality of bit lines BL. The memory blocks BLK1 to BLKz may be connected in common to the bit lines BL. The memory cells of the memory blocks BLK1 to BLKz may have the same structure.

In an embodiment, each of the memory blocks BLK1 to BLKz may correspond to a unit of an erase operation. The memory cells of memory cell array 111 may be erased in units of a memory block. The memory cells belonging to a memory block may be erased at the same time. As another example, each of the memory blocks BLK1 to BLKz may be divided into a plurality of sub-blocks. Each sub-block may correspond to a unit of an erase operation.

Row decoder circuit 112 is connected to memory cell array 111 through the ground selection lines GSL, the word lines WL, the dummy word lines DWL, and the string selection lines SSL. Row decoder circuit 112 operates according to control of control logic circuit 115. Row decoder circuit 112 may decode an address received from a controller 120 (refer to FIG. 14) through an input/output channel and may apply voltages during a program, read, or erase operation to the string selection lines SSL, the word lines WL, the dummy word lines DWL, and the ground selection lines GSL based on the decoded address.

Page buffer circuit 113 is connected to memory cell array 111 through the bit lines BL. Page buffer circuit 113 is connected to data input/output circuit 114 through a plurality of data lines DL. Page buffer circuit 113 operates according to control of control logic circuit 115. During a program operation, page buffer circuit 113 may store data to be programmed in memory cells. Page buffer circuit 113 may apply voltages to the bit lines BL based on the stored data. During a read operation or a verification read operation, page buffer circuit 113 may sense voltages of the bit lines BL and may store the sensed result.

Data input/output circuit 114 is connected with page buffer circuit 113 through the data lines DL. Data input/output circuit 114 may output data, which are read by page buffer circuit 113, to controller 120 through the input/output channel and may send data, which are received from controller 120 through the input/output channel, to page buffer circuit 113.

Control logic circuit 115 may receive a command through the input/output channel and a control signal through a control channel from controller 120. Control logic circuit 115 may decode the received command and may control nonvolatile memory device 110 based on the decoded command. For example, nonvolatile memory device 110 may perform the program, read or erase operation under control of control logic circuit 115.

Control logic circuit 115 may include a word line precharge block 116. Word line precharge block 116 may control row decoder circuit 112 so as to perform a word line precharge operation as will be described below.

Figure 2:
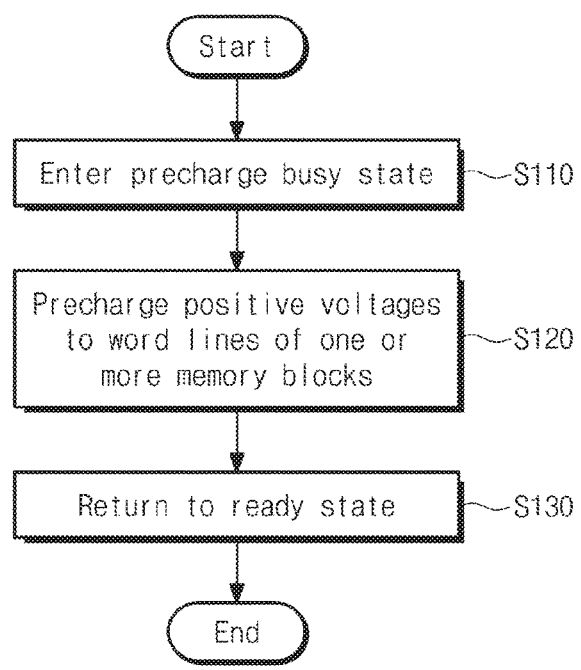
FIG. 2 is a flowchart illustrating an example of a word line precharge operation of the nonvolatile memory device.

FIG. 2 is a flowchart illustrating an example embodiment of a word line precharge operation of nonvolatile memory device 110. Referring to FIGS. 1 and 2, in operation S110, nonvolatile memory device 110 enters a precharge busy state. For example, nonvolatile memory device 110 may enter a precharge mode in response to a command from the outside or when an internal environment satisfies a condition (e.g., power-on or power-off). In the precharge mode, nonvolatile memory device 110 may enter the precharge busy state. In the precharge busy state, nonvolatile memory device 110 may set a signal to a busy state. For example, the signal may be a ready/busy signal at ready/busy signal pin 5, which indicates whether nonvolatile memory device 110 is capable of processing a request (e.g., is in a ready state) or is incapable of processing a request (e.g., is in a busy state). If the ready/busy signal at ready/busy signal pin 5 is already in the busy state, nonvolatile memory device 110 may maintain the busy state of the ready/busy signal at ready/busy signal pin 5.

In operation S120, nonvolatile memory device 110, for example, row decoder circuit 112, may precharge word lines of one or more memory blocks with positive voltages. The precharge may include applying the positive voltages to the word lines and floating the word lines. If the precharge is made, the word lines may be charged with the positive voltages.

In operation S130, nonvolatile memory device 110 may return to the ready state. For example, nonvolatile memory device 110 may set the ready/busy signal at ready/busy signal pin 5 to the ready state.

Unlike a program operation or an erase operation, a word line precharge operation may be performed to charge word lines with the positive voltages without changing data written in memory cells. Unlike a read operation, the word line precharge operation may be performed without using page buffer circuit 113, i.e., without changing voltages applied to the bit lines BL to maintain voltages of the bit lines BL or without applying any voltage to the bit lines BL. For example, the bit lines BL may be floated or may be supplied with a fixed voltage while the word line precharge operation is performed. The word line precharge operation may be performed in two or more memory blocks at the same time. The word line precharge operation may be simultaneously performed in all the memory blocks BLK1 to BLKz, or in only some (i.e., one or more) of the memory blocks BLK1 to BLKz.

The word line precharge operation may not be used to change data written in memory cells or to read data written in memory cells, that is, to access memory cells. The word line precharge operation may be used to improve reliability of data written in memory cells regardless of an access to memory cells.

Figure 3:
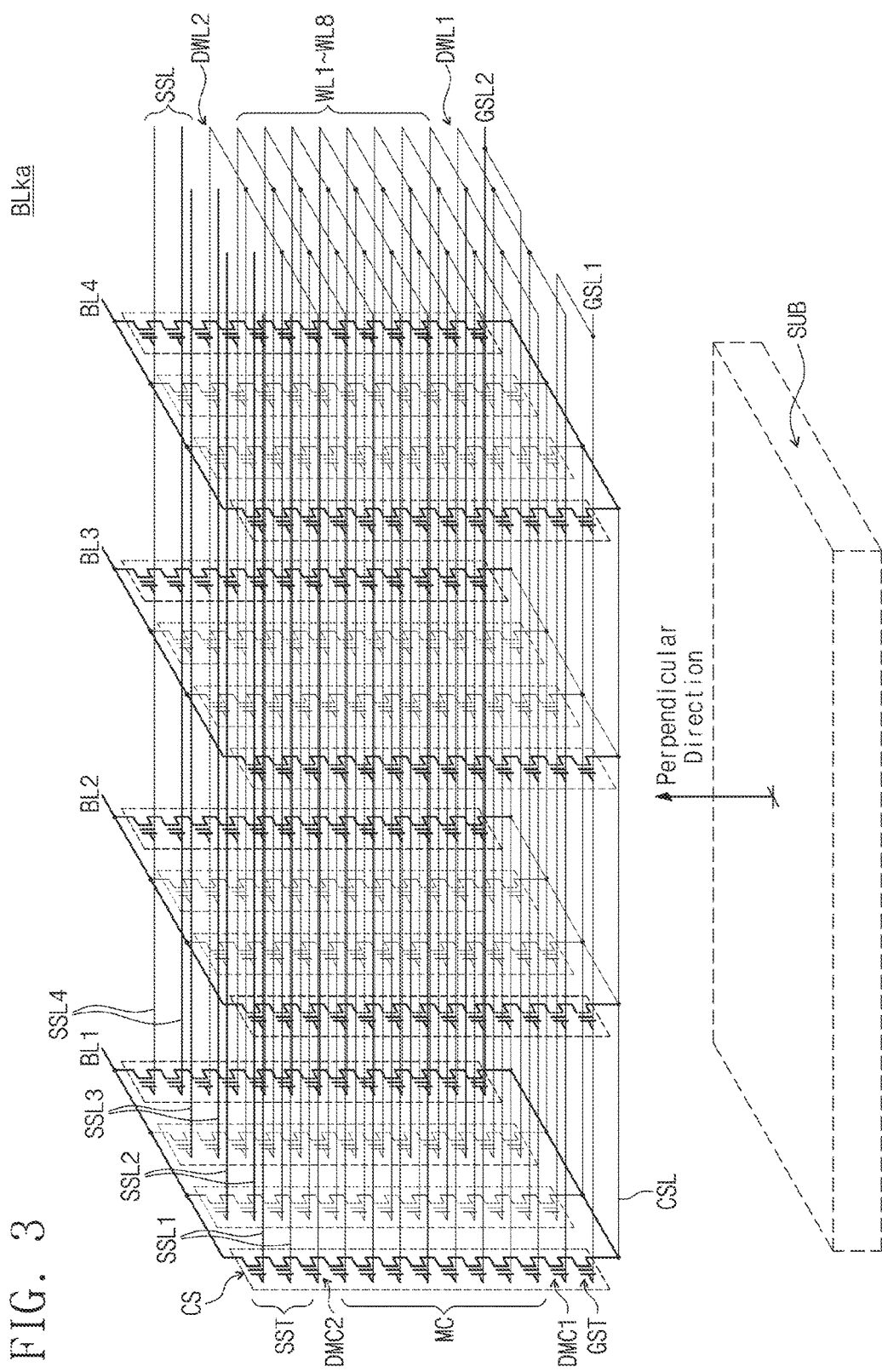
FIG. 3 illustrates an example embodiment of a memory block.
Figure 4:
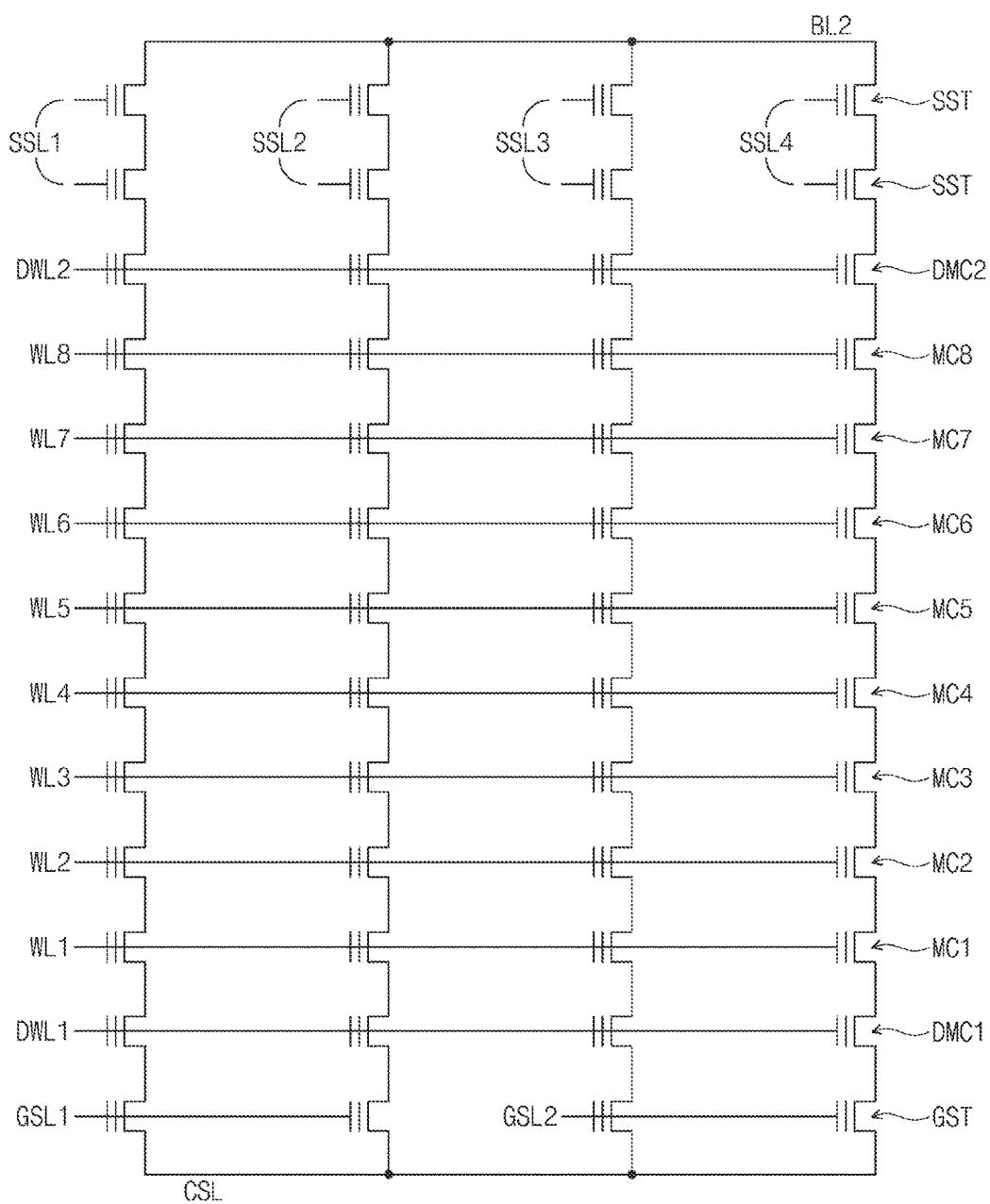
FIG. 4 illustrates cell strings of a memory block of FIG. 3, which corresponds to a second bit line.

FIG. 3 illustrates an example embodiment of a memory block BLKa. FIG. 4 illustrates cell strings CS of the memory block BLKa of FIG. 3, which corresponds to a second bit line BL2. In an embodiment, the cell strings CS connected to the second bit line BL2 are illustrated in FIG. 4. However, cell strings CS connected to a different bit line BL1, BL3, or BL4 may have the same structure as illustrated in FIG. 4.

Referring to FIGS. 3 and 4, the cell strings CS may be arranged on a substrate SUB in rows and columns. The cell strings CS may be connected in common to a common source line CSL that is formed on (or in) the substrate SUB. In FIG. 3, a location of the substrate SUB is exemplified to help understand a structure of the memory block BLKa. An embodiment is exemplified in FIGS. 3 and 4 as the common source line CSL is connected to lower ends of the cell strings CS. However, it does not matter if the common source line CSL is electrically connected to the lower ends of the cell strings CS. Further, embodiments may not be limited to the case that the common source line CSL is physically located at the lower ends of the cell strings CS. An embodiment is exemplified in FIG. 3 as the cell strings CS are arranged in a four-by-four matrix. However, the number of cell strings CS in the memory block BLKa may be more or less than that.

Cell strings of each row may be connected to the corresponding one of first and second ground selection lines GSL1 and GSL2 and to the corresponding one of first to fourth string selection lines SSL1 to SSL4. For example, cell strings of rows corresponding to the first and second string selection lines SSL1 and SSL2 may be connected in common to the first ground selection line GSL1. Cell strings of rows corresponding to the third and fourth string selection lines SSL3 and SSL4 may be connected in common to the second ground selection line GSL2.

Cell strings of each column may be connected to the corresponding one of first to fourth bit lines BL1 to BL4. For ease of illustration, cell strings that are connected to the second and third string selection lines SSL2 and SSL3 are depicted with lighter shading.

Each cell string CS may include at least one ground selection transistor GST having a control terminal connected to the corresponding ground selection line, a plurality of memory cells MC each having a control terminal respectively connected to a plurality of word lines WL1 to WL8, and string selection transistors SST each having a control terminal connected to the corresponding string selection line. In each cell string CS, the ground selection transistor GST, the memory cells MC, and the string selection transistor SST may be serially connected to each other along a direction perpendicular to the substrate SUB and may be sequentially stacked along the direction perpendicular to the substrate SUB.

In an embodiment, in each cell string CS, a first dummy memory cell DMC1 may be provided between the memory cells MC and the ground selection transistor GST. The control terminals of the first dummy memory cells DMC1 of the cell strings CS may be connected in common to a first dummy word line DWL1. In each cell string CS, a second dummy memory cell DMC2 may be provided between the string selection transistors SST and the memory cells MC. The control terminals of the second dummy memory cells DMC2 of the cell strings CS may be connected in common to a second dummy word line DWL2. In each cell string CS, one or more dummy memory cells may be provided between the memory cells MC.

The dummy memory cells DMC1 and DMC2 may have the same structure as the memory cells MC and may not be programmed (e.g., program inhibited) or may be programmed to be different from the memory cells MC. For example, when memory cells are programmed to form two or more threshold voltage distributions, the dummy memory cells DMC1 and DMC2 may be programmed to have one threshold voltage distribution range.

Control terminals of memory cells of the cell strings CS that are located at the same height (or order) from the substrate SUB or the ground selection transistor GST may be electrically connected to each other. Memory cells of the cell strings CS that are arranged at different heights (or orders) from the substrate SUB or the ground selection transistor GST may be electrically separated from each other. An embodiment is exemplified in FIG. 3 as memory cells of the same height are connected to the same word line. However, the memory cells of the same height may be directly connected to each other in a plane where the memory cells are formed, or may be indirectly connected to each other through another layer such as a metal layer.

The memory block BLKa may be provided at a three-dimensional (3D) memory array. The 3D memory array is monolithically formed in one or more physical levels of arrays of memory cells MC having an active area disposed above a silicon substrate and a circuitry associated with the operation of those memory cells MC. The circuit associated with an operation of memory cells MC may be located above or within such substrate. The term "monolithic" means that layers of each level of the 3D array are directly deposited on the layers of each underlying level of the 3D memory array.

In an embodiment, the 3D memory array includes vertical NAND strings (or cell strings) that are vertically oriented such that at least one memory cell is located over another memory cell. The at least one memory cell may comprise a charge trap layer. Each vertical NAND string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 5:
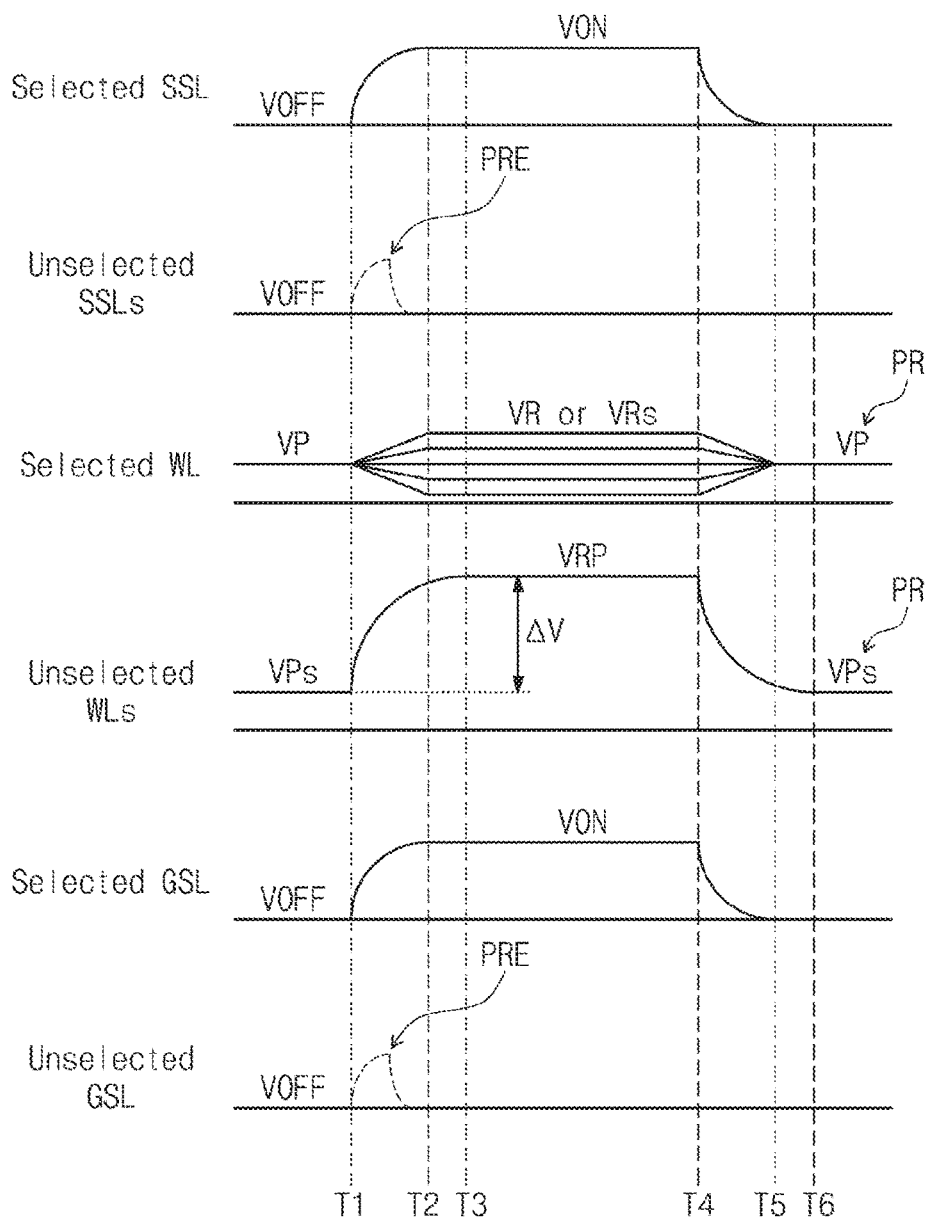
FIG. 5 illustrates changes in voltages when a read operation is performed on the cell strings of FIGS. 3 and 4.

FIG. 5 illustrates changes in voltages when a read operation is performed on the cell strings CS of FIGS. 3 and 4. FIG. 5 shows that voltages vary with the passage of time. Referring to FIGS. 3 to 5, a selected memory block and unselected memory blocks may be distinguished (or identified or addressed) from each other upon performing the read operation. For example, a memory block that includes memory cells identified as a read target by an address for a read operation received from an external device may be referred to as a selected memory block, and the remaining memory blocks may be referred to as unselected memory blocks.

A selected string selection line and unselected string selection lines may be distinguished from each other upon performing the read operation. For example, in the selected memory block, a string selection line that corresponds to memory cells identified as a read target by an address for a read operation received from an external device may be referred to as a selected string selection line, and the remaining string selection lines may be referred to as unselected string selection lines.

A selected ground selection line and unselected ground selection lines may be distinguished from each other upon performing the read operation. For example, in the selected memory block, a ground selection line that corresponds to memory cells identified as a read target by an address for a read operation received from an external device may be referred to as a selected ground selection line, and the remaining ground selection lines may be referred to as unselected ground selection lines.

A selected word line and unselected word lines may be distinguished from each other upon performing the read operation. For example, in the selected memory block, a word line that corresponds to memory cells identified as a read target by an address for a read operation received from an external device may be referred to as a selected word line, and the remaining word lines may be referred to as unselected word lines.

At a first time point T1, an ON voltage VON is applied to the selected string selection line. The ON voltage VON may have a level which is sufficient to turn on the string selection transistors SST. At the first time point T1, an OFF voltage VOFF may be applied to the unselected string selection lines, or voltages of the unselected string selection lines may be maintained at the OFF voltage VOFF. The OFF voltage VOFF may have a level which is sufficient to insure that the string selection transistors SST is turned off. As another embodiment, at the first time point T1, the OFF voltage VOFF may be applied to the unselected string selection lines after a prepulse PRE is applied thereto. The prepulse PRE may have a level which is sufficient to turn on the string selection transistors SST. That is, string selection transistors connected to the unselected string selection lines may be turned on and then turned off.

At the first time point T1, one read voltage VR of read voltages VRs is applied to the selected word line. The read voltages VRs may have levels between threshold voltage distribution ranges of the memory cells MC, which are formed according to data written in the memory cells MC. One of the read voltages VRs may be selected according to a threshold voltage level to be determined during a currently performed read operation. At the first time point T1, a read pass voltage VRP is applied to the unselected word lines. The read pass voltage VRP may have a level sufficient to turn on the memory cells MC.

At the first time point T1, the ON voltage VON is applied to the selected ground selection line. At the first time point T1, the OFF voltage VOFF may be applied to the unselected ground selection lines, or voltages of the unselected ground selection lines may be maintained at the OFF voltage VOFF. As another embodiment, at the first time point T1, the OFF voltage VOFF may be applied to the unselected ground selection lines after the prepulse PRE is applied thereto.

At a second time point T2, a voltage of the selected string selection line may reach a target level of the ON voltage VON. A voltage of the selected word line may reach a target level of the read voltage VR. A voltage of the selected ground selection line may reach a target level of the ON voltage VON.

At a third time point T3, voltages of the unselected word lines may reach a target level of the read pass voltage VRP.

Between the first time point T1 and the third time point T3, voltages of the unselected word lines may increase by a voltage difference ΔV.

At a fourth time point T4, voltages of the selected string selection line, the selected word line, the unselected word lines, and the selected ground selection line may start to be recovered.

At a fifth time point T5, a voltage of the selected string selection line is recovered to the OFF voltage VOFF. A voltage of the selected word line is recovered to a positive voltage VP. A voltage of the selected ground selection line is recovered to the OFF voltage VOFF.

At a sixth time point T6, voltages of the unselected word lines are recovered to positive voltages VPs. The positive voltage VP and the positive voltages VPs may have the same level or different levels.

In FIG. 5, voltages of the word lines WL1 to WL8 are recovered to the positive voltage VP or the positive voltages VPs. This is referred to as "positive recovery PR." Compared with the case where voltages of word lines are recovered to a ground voltage, if the positive recovery PR is performed, it is easy to adjust a voltage of the selected word line to one read voltage VR of the read voltages VRs, and thus, a time to adjust may decrease. Also, compared with the case where voltages of word lines are recovered to a ground voltage, if the positive recovery PR is performed, the voltage difference ΔV by which voltages of the unselected word lines increase may decrease, thereby reducing coupling between the unselected word lines and channels of corresponding memory cells. According to the positive recovery PR, as understood from FIG. 5, voltages of selected and unselected word lines are set to the positive voltage VP or the positive voltages VPs before the first time point T1.

In an embodiment, voltages that are the same or less than voltages applied to the word lines WL1 to WL8 may be applied to the dummy word lines DWL1 and DWL2.

Figure 6:
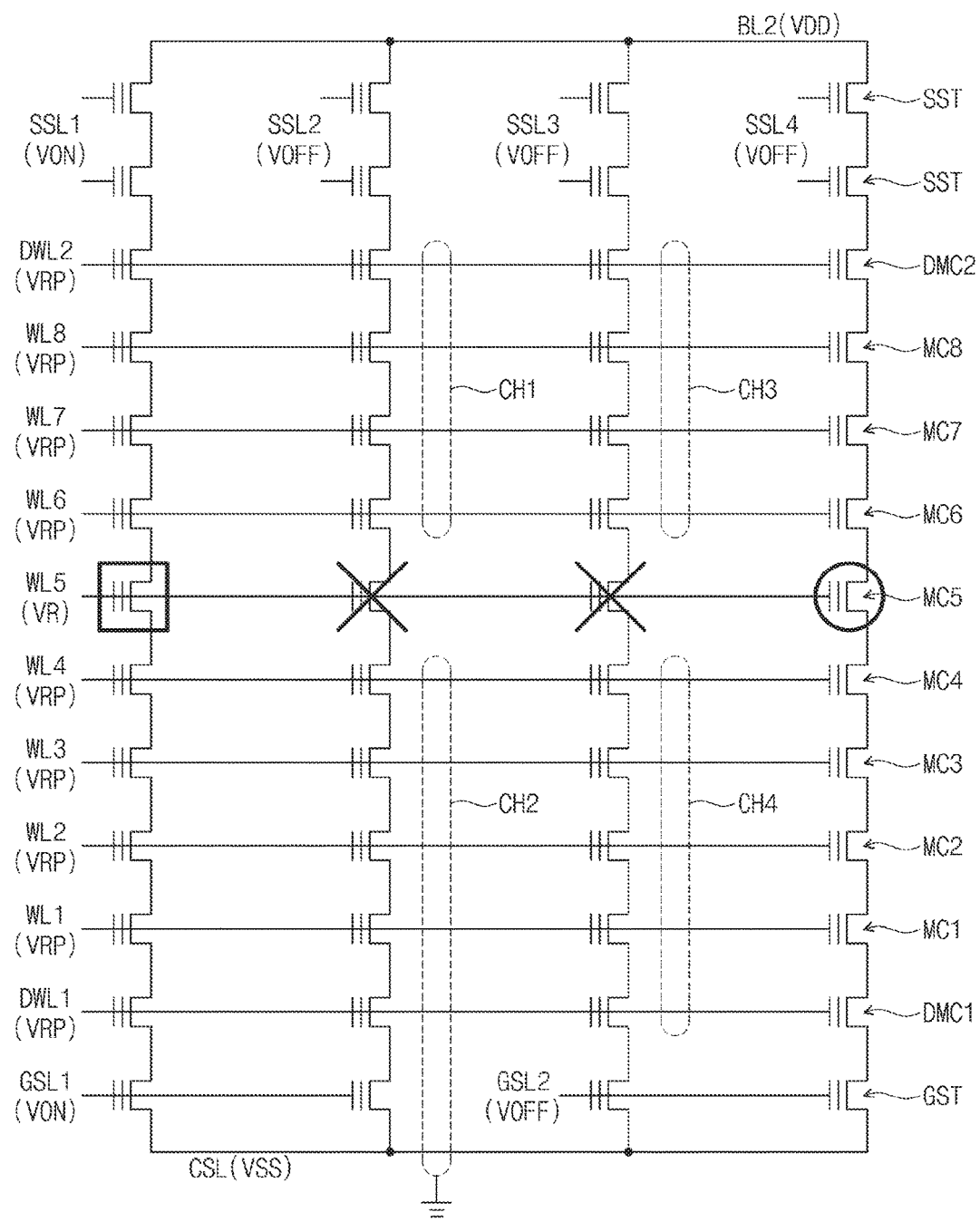
FIG. 6 illustrates states of the cell strings connected to the second bit line upon applying voltages of FIG. 5.

FIG. 6 illustrates states of the cell strings connected to the second bit line BL2 upon applying voltages of FIG. 5. In an embodiment, it is assumed that a memory cell defined by the first string selection line SSL1 and the fifth word line WL5 is selected as a read target. In FIG. 6 the memory cell selected as a read target is identified by being placed inside of a square.

Referring to FIGS. 3, 5, and 6, the ON voltage VON is applied to the first string selection line SSL1, and the OFF voltage VOFF is applied to the second to fourth string selection lines SSL2 to SSL4, respectively. The read voltage VR is applied to the fifth word line WL5, and the read pass voltage VRP is applied to the remaining word lines WL1 to WL4 and WL6 to WL8 and the first and second dummy word lines DWL1 and DWL2, respectively. The ON voltage VON is applied to the first ground selection line GSL1, and the OFF voltage VOFF is applied to the second ground selection line GSL2.

In an embodiment, it is assumed that memory cells corresponding to the second and third string selection lines SSL2 and SSL3 and the fifth word line WL5 are turned off by the read voltage VR. In FIG. 6, an "X" mark indicates turned-off memory cells. It is assumed that memory cells corresponding to the fourth string selection line SSL4 and the fifth word line WL5 are turned on by the read voltage VR. In FIG. 6 a memory cell which is turned-on is indicating by being placed inside a circle.

During a read operation, bit lines may be floated after being charged with a positive voltage, for example, a power supply voltage VDD, and a ground voltage may be supplied to the common source line CSL.

In a cell string corresponding to the second string selection line SSL2, a channel that is formed by memory cells of the cell string is separated into a first channel CH1 and a second channel CH2 by the turned-off memory cell. In a cell string corresponding to the third string selection line SSL3, a channel that is formed by memory cells of the cell string is separated into a third channel CH3 and a fourth channel CH4 by the turned-off memory cell.

Figure 7:
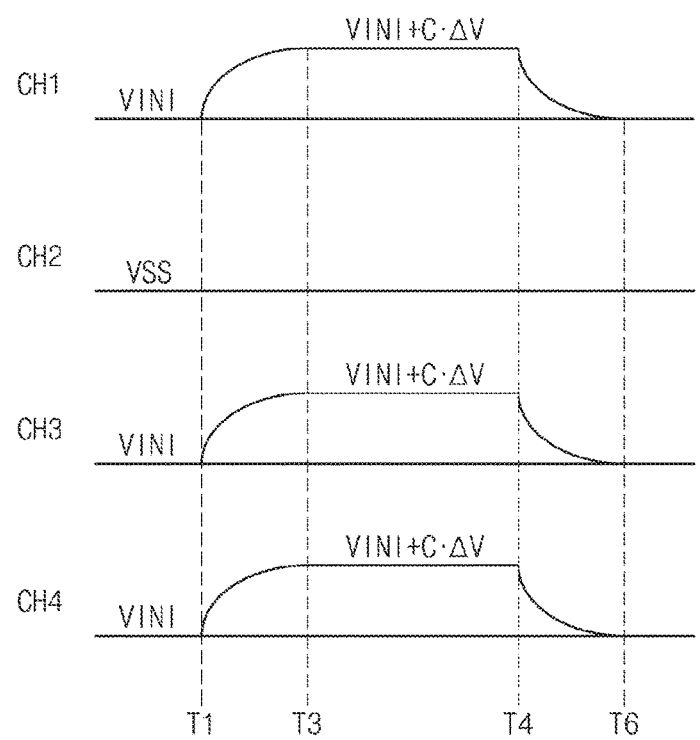
FIG. 7 illustrates an example in which voltages of channels change due to changes of voltages of FIG. 5 in the cell strings of FIG. 6.

FIG. 7 illustrates an example in which voltages of channels change due to changes of voltages of FIG. 5 in cell strings of FIG. 6. Referring to FIGS. 6 and 7, the second channel CH2 is connected to the common source line CSL through the ground selection transistor GST. Since the second channel CH2 is connected to the common source line CSL by the ON voltage VON being applied to the first ground selection line GSL1, a voltage of the second channel CH2 is a ground voltage VSS.

The first channel CH1 is a floated channel. Accordingly, the first channel CH1 may be affected by coupling of the voltage difference ΔV by which voltages of the sixth to eighth word lines WL6 to WL8 and the second dummy word line DWL2 increase. Due to the affect of the coupling, a voltage (or potential) of the first channel CH1 increases from an initial voltage VINI by (ΔV*C) (C being a coupling coefficient).

The third channel CH3 is a floated channel. Accordingly, a voltage of the third channel CH3 changes to be similar to a voltage of the first channel CH1.

The fourth channel CH4 is also a floated channel. Accordingly, a voltage of the fourth channel CH4 changes to be similar to a voltage of the first channel CH1, except the fourth channel CH4 is affected by coupling from the first to fourth word lines WL1 to WL4 and the first dummy word line DWL1.

A voltage difference occurs between the first channel CH1 and the second channel CH2. As the voltage difference between the first and second channels CH1 and CH2 increases, the probability that hot electrons or carriers are generated between the first and second channels CH1 and CH2 increases, and the probability that hot electron injection or hot carrier injection occurs increases. If the hot electron injection or hot carrier injection occurs, threshold voltages of memory cells that are located between the first and second channels CH1 and CH2 or on the border between the first and second channels CH1 and CH2 may be changed, and thus, data written in the memory cells may be damaged or corrupted.

To prevent the above issue, the prepulse PRE (refer to FIG. 5) may be applied to the unselected string selection line such that a portion of an increased voltage of the first channel CH1 is discharged through the string selection transistor SST, and thus, a voltage difference between the first and second channels CH1 and CH2 may decrease. Also, the positive voltage VP or the positive voltages VPs of the positive recovery PR may suppress a voltage increase of the first channel CH1, and thus, a voltage difference between the first and second channels CH1 and CH2 may decrease.

Figure 8:
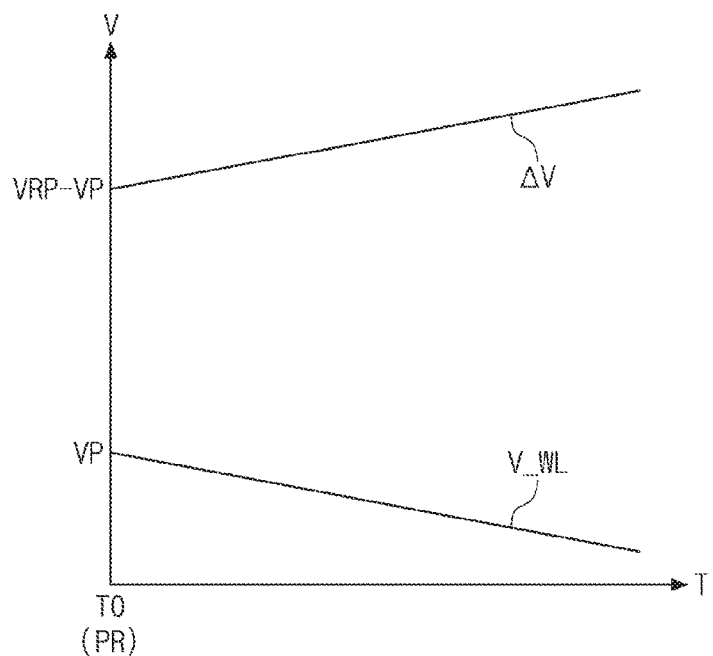
FIG. 8 illustrates an example in which voltages vary with the passage of time.

FIG. 8 illustrates an example in which voltages vary with the passage of time. In FIG. 8, a horizontal axis represents a time T, and a vertical axis represents a voltage V. In an embodiment, FIG. 8 shows that a word line voltage V_WL and the voltage difference ΔV vary with the passage of time when memory cells are left alone while a program operation, a read operation, and an erase operation are not performed on the memory block BLKa. For a brief description, that the word line voltage V_WL and the voltage difference ΔV of one word line vary is illustrated in FIG. 8.

If an access operation such as the program operation, the read operation, or the erase operation is performed on memory cells, a word line may be charged with the word line voltage V_WL that is the positive voltage VP. Afterwards, if the memory cells are not accessed, that is, are left alone, the positive voltage VP charged to the word line may be discharged with the passage of time. As a peripheral temperature increased, the discharge of the positive voltage VP charged to the word line may become quicker. That is, the word line voltage V_WL may gradually decrease from the positive voltage VP with the passage of time.

Figure 9:
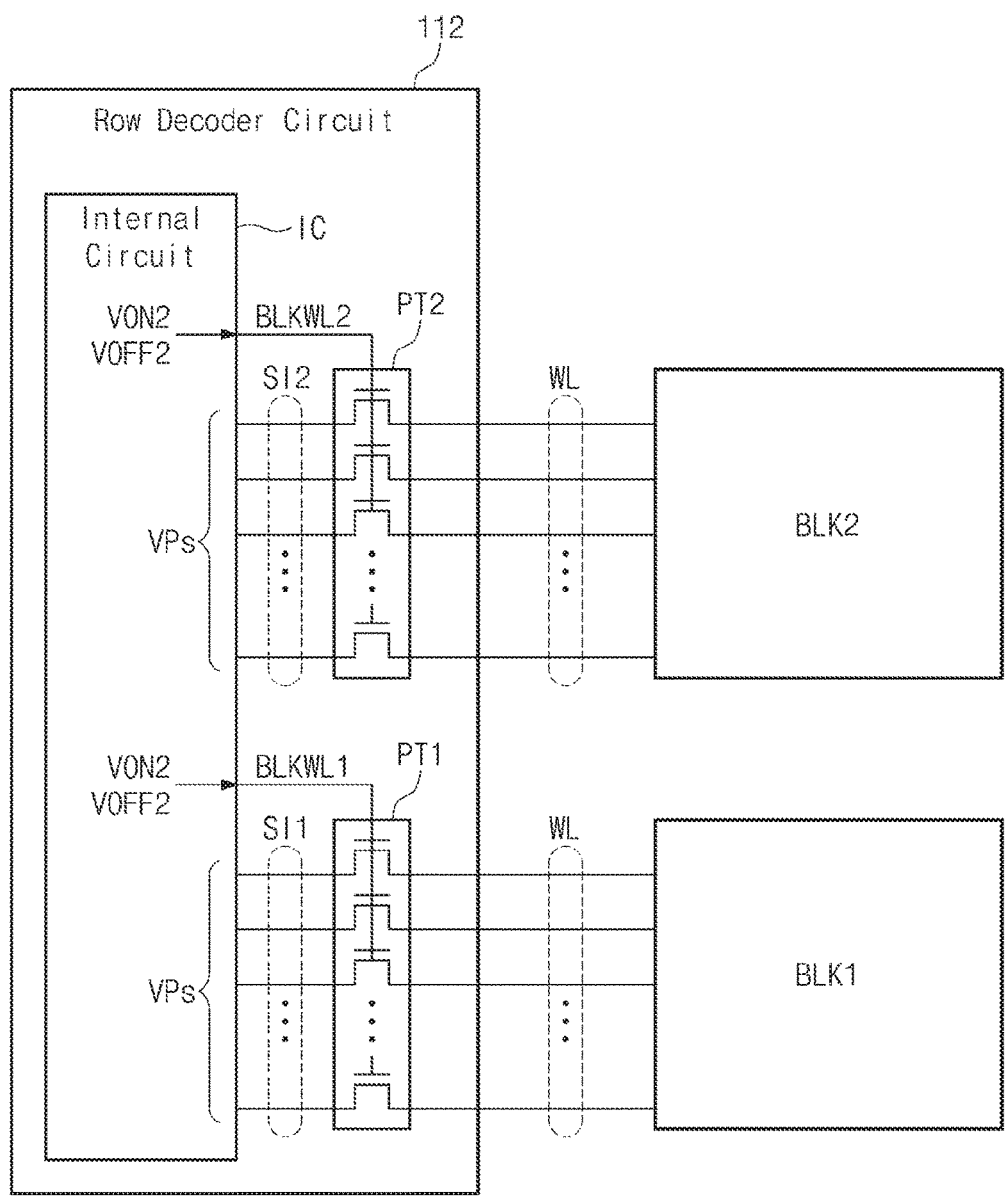
FIG. 9 illustrates an example of memory blocks and a row decoder circuit associated with the word line precharge operation.

Also, the word lines WL1 to WL8, DWL1, and DWL2 of a plurality of memory blocks are connected to common supply lines through pass transistors (refer to FIG. 9). Voltages that are supplied to the supply lines are provided to the word lines WL1 to WL8, DWL1, and DWL2 through pass transistors of a selected memory block. When voltages are supplied to the word lines WL1 to WL8, DWL1, and DWL2 of the selected memory block through the supply lines and are recovered, voltage changes of the supply lines may have an influence on voltages of the word lines WL1 to WL8, DWL1, and DWL2 of unselected memory blocks due to coupling. For example, when voltages of the supply lines are recovered, voltages of the word lines WL1 to WL8, DWL1, and DWL2 of the unselected memory blocks may decrease.

As the word line voltage V_WL decreases, the voltage difference ΔV may gradually increase. That is, in the case where a read operation is performed on memory cells after the memory cells are not accessed and are left alone for a period of time, the voltage difference ΔV may increase as a time (hereinafter referred to as a "leaving alone time") when the memory cells are left alone increases. Accordingly, as the leaving alone time increases, the probability that hot electron injection or hot carrier injection occurs in the first and second channels CH1 and CH2 during a read operation increases. This means that the probability that data is damaged or corrupted increases.

Also, the degree of voltage decreases of word lines may vary according to characteristics of the word lines given in a manufacturing process and according to locations of the word lines in the memory cell array 111 (refer to FIG. 1). That is, voltages of the third and fourth channels CH3 and CH4 may change. Accordingly, as the leaving alone time increases, the probability that hot electron injection or hot carrier injection occurs in the third and fourth channels CH3 and CH4 during a read operation increases. This means that the probability that data is damaged increases.

To prevent the above issue, nonvolatile memory device 110 may perform a word line precharge operation in which word lines are charged with positive voltages without accessing memory cells.

FIG. 9 illustrates an example of the memory blocks BLK1 and BLK2 and the row decoder circuit 112 associated with the word line precharge operation. Referring to FIGS. 1 and 9, the row decoder circuit 112 includes first pass transistors PT1 corresponding to the first memory block BLK1, second pass transistors PT2 corresponding to the second memory block BLK2, and an internal circuit IC. In an embodiment, it is assumed that the first and second memory blocks BLK1 and BLK2 are selected as a target of the word line precharge operation.

The first pass transistors PT1 may be disposed between word lines WL of the first memory block BLK1 and first supply lines Sl1 connected to the internal circuit IC and may electrically connect the word lines WL and the first supply lines Sl1 in response to a voltage of a first block word line BLKWL1. The second pass transistors PT2 may be disposed between word lines WL of the second memory block BLK2 and second supply lines Sl2 connected to the internal circuit IC and may electrically connect the word lines WL and the second supply lines Sl2 in response to a voltage of a second block word line BLKWL2. In an embodiment, the first supply lines Sl1 and the second supply lines Sl2 may be connected in common in the internal circuit IC.

The internal circuit IC may provide necessary voltages to the word lines WL of the first memory block BLK1 by using the first block word line BLKWL1 and the first supply lines Sl1 during a program operation, a read operation, or an erase operation. The internal circuit IC may provide necessary voltages to the word lines WL of the second memory block BLK2 by using the second block word line BLKWL2 and the second supply lines Sl2 during the program operation, the read operation, or the erase operation.

During the word line precharge operation, the internal circuit IC may simultaneously apply a second ON voltage VON2 to the first and second block word lines BLKWL1 and BLKWL2. The second ON voltage VON2 may have a level which is sufficient to turn on the first and second pass transistors PT1 and PT2. The internal circuit IC may simultaneously apply the positive voltages VPs to the first supply lines Sl1 and the second supply lines Sl2. If word lines WL1 and WL2 of the first and second memory blocks BLK1 and BLK2 are charged with the positive voltages VPs, the internal circuit IC applies a second OFF voltage VOFF2 to the first and second block word lines BLKWL1 and BLKWL2. The second OFF voltage VOFF2 may have a level which is sufficient to insure that the first and second pass transistors PT1 and PT2 are turned off. That is, word lines are floated after the word lines of the first and second memory blocks BLK1 and BLK2 are charged with the positive voltages VPs.

An embodiment is illustrated in FIG. 9 where the word lines WL of the two memory blocks BLK1 and BLK2 are simultaneously precharged. However, embodiments may not be limited thereto. The nonvolatile memory device 110 may simultaneously charge word lines of one or more memory blocks during the word line precharge operation.

In an embodiment, the first supply lines Sl1 and the second supply lines Sl2 may be connected in common in the internal circuit IC. For example, a supply line, of the first supply lines Sl1, which corresponds to a first word line of the memory block BLK1, and a supply line, of the second supply lines Sl2, which corresponds to a first word line of the memory block BLK2, may be connected in common in the internal circuit IC. A supply line, of the first supply lines Sl1, which corresponds to a k-th (k being a positive integer) of the memory block BLK1, and a supply line, of the second supply lines Sl2, which corresponds to a k-th word line of the memory block BLK2, may be connected in common in the internal circuit IC.

One memory block corresponds to one set of pass transistors and one supply line. Block word lines connected to pass transistors associated with two or more memory blocks may be connected in common or may be controlled identically. That is, pass transistors associated with two or more memory blocks may be simultaneously turned on or turned off. Memory blocks that are associated with pass transistors simultaneously turned on/off may be identified as belonging to the same group. A plurality of memory blocks may form a plurality of groups, each of which includes two or more memory blocks. Supply lines of two or more memory blocks may be connected in common in the internal circuit IC. That is, the same voltage may be supplied to the supply lines of the two or more memory blocks. Memory blocks that share supply lines may be identified as belonging to the same set. The memory blocks may form a plurality of sets, each of which includes two or more memory blocks. Units or targets of groups and sets may be the same as or different from each other.

Figure 10:
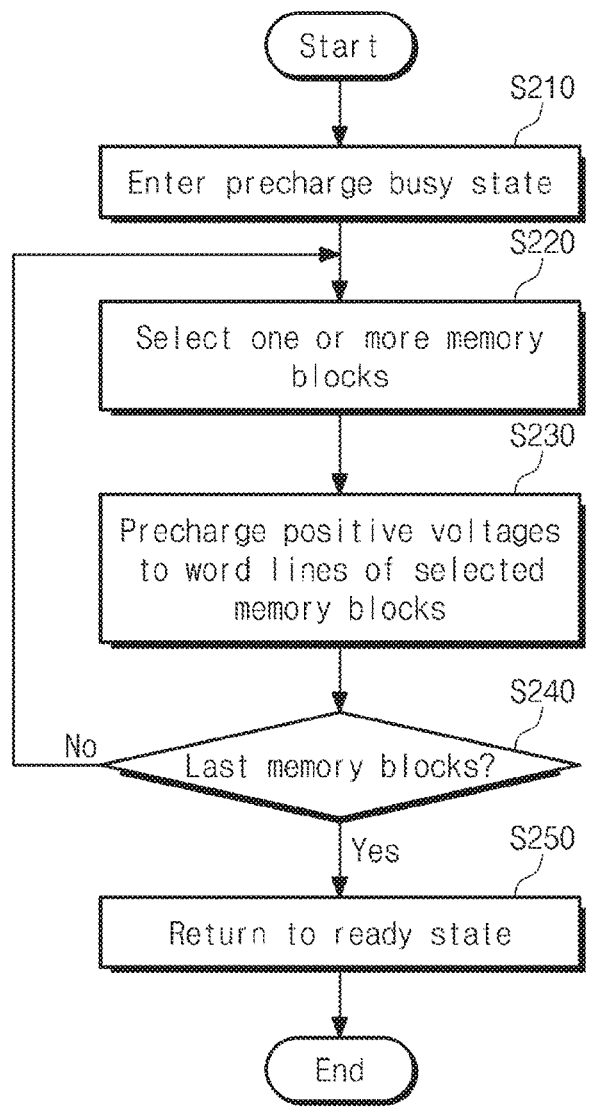
FIG. 10 is a flowchart illustrating another example embodiment of an operating method of the nonvolatile memory device.

FIG. 10 is a flowchart illustrating another example of an operating method of the nonvolatile memory device 110. Referring to FIGS. 1 and 9, in operation S210, the nonvolatile memory device 110 enters a precharge busy state. Operation S210 may correspond to operation S110 of FIG. 2.

In operation S220, nonvolatile memory device 110, in more detail, control logic circuit 115, may select one or more memory blocks. For example, control logic circuit 115 may select one or more memory blocks that are some of memory blocks selected as a target of the word line precharge operation.

In operation S230, nonvolatile memory device 110, in more detail, control logic circuit 115, may control row decoder circuit 112 such that word lines of the selected memory blocks are precharged with positive voltages. The precharge operation may include supplying a positive voltage to each of word lines by turning on pass transistors PT1 or PT2 and floating the word lines by turning off the pass transistors PT1 or PT2, in no connection with page buffer circuit 113. For example, the positive voltage may be an external power supply voltage supplied from the outside to nonvolatile memory device 110, an internal power supply voltage that the nonvolatile memory device 110 generates based on external power supply voltage, or a voltage of a preset level. Information about a level of positive voltage may be set through a fuse option of the nonvolatile memory device 110 or may be provided from a controller of the nonvolatile memory device 110. For example, fuse option may include setting information based on whether a laser fuse or an electrical fuse included in nonvolatile memory device 110 is cut.

In operation S240, nonvolatile memory device 110, in more detail, the control logic circuit 115, may determine whether selected memory blocks are the last memory blocks. For example, control logic circuit 115 may determine whether the selected memory blocks are the last memory blocks that need the word line precharge operation. Control logic circuit 115 may determine whether the word line precharge operation is performed on all memory blocks selected as a target of the word line precharge operation.

If the selected memory blocks are not the last memory blocks, the process proceeds to operation S220, in which one or more memory blocks are selected as described above. If the selected memory blocks are the last memory blocks, the process proceeds to operation S250.

In operation S250, nonvolatile memory device 110 enters a ready state. Operation S250 may correspond to operation S130 of FIG. 2.

As described with reference to FIG. 10, nonvolatile memory device 110 may divide memory blocks selected as a target of the word line precharge operation into partial groups and may sequentially perform the word line precharge operation on the partial groups. Each of the partial groups may include one or more memory blocks. For example, each partial group may include 128 or 256 memory blocks. If the memory blocks are precharged while being divided into partial memory blocks, it may be possible to reduce peak power consumed by nonvolatile memory device 110 during the word line precharge operation.

In an embodiment, nonvolatile memory device 110 may include a bad block management system. According to the bad block management system, nonvolatile memory device 110 may store and manage information of bad blocks. If an address corresponding to a bad block is input from a controller, nonvolatile memory device 110 may deny an access to the input address or may access another memory block that is used to repair the bad block.

Since a plurality of memory blocks are simultaneously selected during the word line precharge operation, a normal algorithm for selecting one or several memory blocks by using an address may be deactivated during the word line precharge operation. Accordingly, the bad block management system may be also deactivated. If the bad block management system is deactivated, the word line precharge operation may be performed even on bad blocks. Some of the bad blocks may occur due to short-circuited wires. If a positive voltage for the word line precharge operation is supplied to a bad block in which wires are short-circuited, the positive voltage may be leaked out through the short-circuited wires. That is, a word line precharge voltage supplied to a plurality of memory blocks may decrease, and thus, the word line precharge operation may not be performed normally.

To prevent the above issue, a bad block non-selection operation may be further performed. For example, in operation S110 or S210, nonvolatile memory device 110 may select all memory blocks, which include user memory blocks and reserved memory blocks, as a target of the word line precharge operation. Nonvolatile memory device 110 may search for bad blocks recorded in the bad block management system and may exclude the found bad blocks from the target of the word line precharge operation. As another embodiment, in operation S220, nonvolatile memory device 110 may search for a bad block of memory blocks of a selected partial group with reference to the bad block management system. Nonvolatile memory device 110 may exclude the found bad blocks of the memory blocks in the selected partial group from the target of the word line precharge operation.

In an embodiment, information of bad blocks may be received from an external controller. In this case, nonvolatile memory device 110 may further search for a bad block with reference to the information from the controller and may exclude the found bad block from the target of the word line precharge operation.

In an embodiment, the bad block management system may be implemented with any one of control logic circuit 115 and row decoder circuit 112 of nonvolatile memory device 110 or with any combination thereof.

Figure 11:
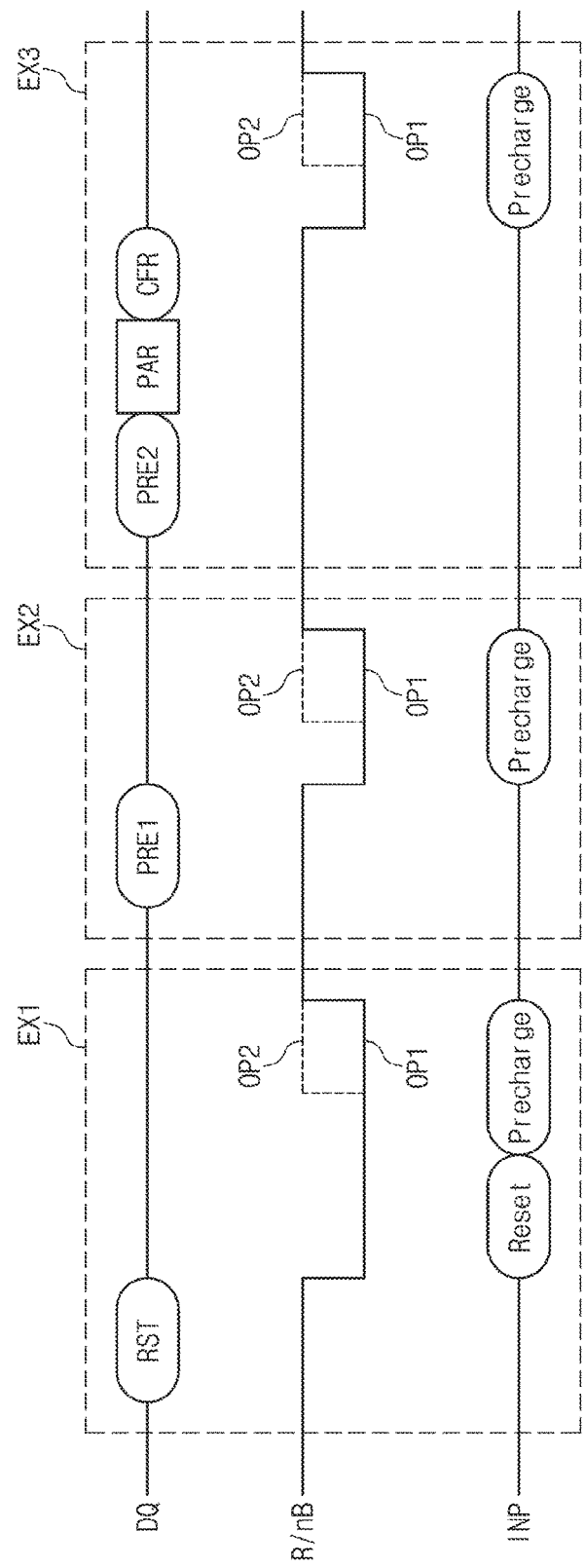
FIGS. 11 and 12 illustrate examples of commands causing the word line precharge operation in the nonvolatile memory device.
Figure 12:
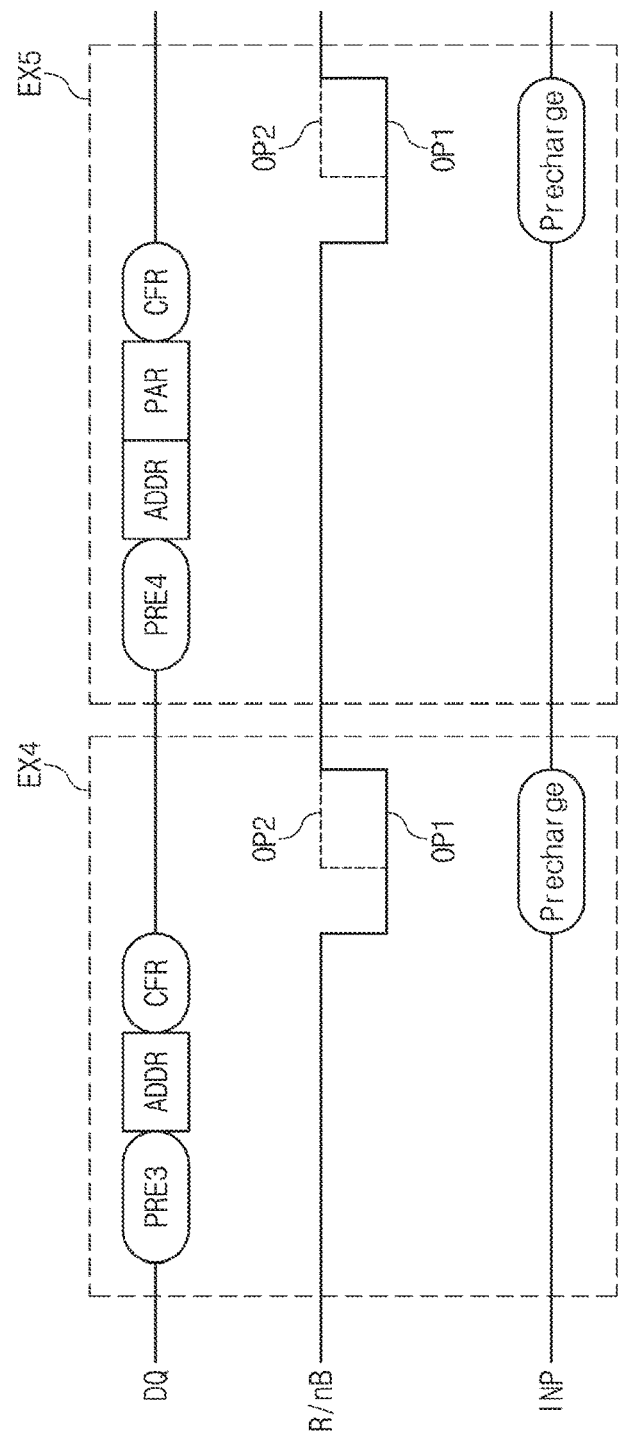

FIGS. 11 and 12 illustrate examples of commands causing the word line precharge operation in nonvolatile memory device 110. A signal transmitted through data lines DQ of nonvolatile memory device 110, a signal transmitted through a ready/busy signal line R/nB, and an internal process of nonvolatile memory device 110 are illustrated with the passage of time in FIGS. 11 and 12. The data lines DQ may be lines through which nonvolatile memory device 110 exchanges data, commands, and addresses with an external controller. The ready/busy signal line R/nB may be a control signal line connected to ready/busy signal pin 5 for nonvolatile memory device 110 to inform an external controller whether it is capable of processing a request of the controller (in a ready state), or is incapable of processing a request of the controller (in a busy state).

Referring to a first example EX1 of FIG. 11, nonvolatile memory device 110 may receive a reset command RST through the data lines DQ. When the reset command RST is received, nonvolatile memory device 110 may switch a signal of the ready/busy signal line R/nB and ready/busy signal pin 5 from the ready state (e.g., logical high) to the busy state (e.g., logical low) and may perform a reset operation. For example, the reset operation may include initial data read (IDR) for obtaining information about internal parameters such as voltage levels of nonvolatile memory device 110. When the reset operation is completed, nonvolatile memory device 110 may enter a precharge busy state (refer to FIGS. 2 and 10) while maintaining the signal of the ready/busy signal line R/nB and ready/busy signal pin 5 at the busy state (logical low). Nonvolatile memory device 110 may perform the word line precharge operation. That is, nonvolatile memory device 110 may cause ready/busy signal pin 5 to indicate that nonvolatile memory device 110 is in a precharge busy state wherein nonvolatile memory device 110 is not available to perform memory access operations for the nonvolatile memory cells MC, and may apply one or more word line precharge voltages to one or more selected word lines WL of nonvolatile memory device 110 among the plurality of word lines WL to precharge the selected word lines WL in response to the reset command RST.

According to a first option OP1, when the word line precharge operation is completed, nonvolatile memory device 110 may switch the signal of the ready/busy signal line R/nB and ready/busy signal pin 5 from the busy state (logical low) to the ready state (logical high).

In an embodiment, the word line precharge operation only needs row decoder circuit 112 and word lines WL of nonvolatile memory device 110. During the word line precharge operation, data input/output circuit 114 and page buffer circuit 113 are not used. Even through the word line precharge operation is not completed, nonvolatile memory device 110 may receive a command or an address from an external controller, may receive data, may store the received data in data input/output circuit 114, and may load the data stored in data input/output circuit 114 onto page buffer circuit 113. According to a second option OP2, nonvolatile memory device 110 may switch the signal of the ready/busy signal line R/nB and ready/busy signal pin 5 from the busy state (logical low) to the ready state (logical high) before the word line precharge operation is completed. That is, after at least a portion of the word line precharge operation is performed, nonvolatile memory device 110 may cause ready/busy signal pin 5 to transition from indicating the precharge busy state, to indicating that nonvolatile memory device 110 is in a ready state wherein nonvolatile memory device 110 is available to perform memory access operations for the nonvolatile memory cells (MC).

As described with reference to the first example EX1, if the reset command RST is received by nonvolatile memory device 110, nonvolatile memory device 110 may perform the reset operation and may automatically perform the word line precharge operation following the reset operation. In an embodiment, in response to the reset command RST, nonvolatile memory device 110 may select all the memory blocks BLK1 to BLKz of memory cell array 111 as a target of the word line precharge operation.

Referring to a second example EX2 of FIG. 11, nonvolatile memory device 110 may receive a first precharge command PRE1 through the data lines DQ. In response to the first precharge command PRE1, nonvolatile memory device 110 may switch a signal of the ready/busy signal line R/nB and ready/busy signal pin 5 from the ready state (logical high) to the busy state (logical low) and may perform the word line precharge operation. After the word line precharge operation is completed according to the first option OP1, or after only a portion of the word line precharge operation is performed and before the word line precharge operation is completed according to the second option OP2, nonvolatile memory device 110 may switch the signal of the ready/busy signal line R/nB and ready/busy signal pin 5 from the busy state (logical low) to the ready state (logical high). In an embodiment, in response to the first precharge command PRE1, nonvolatile memory device 110 may select all the memory blocks BLK1 to BLKz of memory cell array 111 as a target of the word line precharge operation.

Referring to a third example EX3 of FIG. 11, nonvolatile memory device 110 may receive a second precharge command PRE2, a parameter PAR, and a confirm command CFR through the data lines DQ. The parameter PAR may provide information about various conditions for the word line precharge operation and may include, for example, information about levels of the positive voltages VPs. The confirm command CFR may be a command to request whether to perform the word line precharge operation by using the parameter PAR.

In response to the second precharge command PRE2, the parameter PAR, and the confirm command CFR, nonvolatile memory device 110 may switch a signal of the ready/busy signal line R/nB and ready/busy signal pin 5 from the ready state (logical high) to the busy state (logical low) and may perform the word line precharge operation. Nonvolatile memory device 110 may adjust various conditions of the word line precharge operation, for example, levels of the positive voltages VPs by using the information included in the parameter PAR and may perform the word line precharge operation. After the word line precharge operation is completed according to the first option OP1, or after only a portion of the word line precharge operation is performed and before the word line precharge operation is completed according to the second option OP2, nonvolatile memory device 110 may switch the signal of the ready/busy signal line R/nB and ready/busy signal pin 5 from the busy state (logical low) to the ready state (logical high). In an embodiment, in response to the second precharge command PRE2, nonvolatile memory device 110 may select all the memory blocks BLK1 to BLKz of memory cell array 111 as a target of the word line precharge operation.

Referring to a fourth example EX4 of FIG. 12, nonvolatile memory device 110 may receive a third precharge command PRE3, an address ADDR, and the confirm command CFR through the data lines DQ. The address ADDR may be used to distinguish some, of the memory blocks BLK1 to BLKz of memory cell array 111 which correspond to a target of the word line precharge operation.

In response to the third precharge command PRE3, the address ADDR, and the confirm command CFR, nonvolatile memory device 110 may switch a signal of the ready/busy signal line R/nB and ready/busy signal pin 5 from the ready state (logical high) to the busy state (logical low) and may perform the word line precharge operation. Nonvolatile memory device 110 may perform the word line precharge operation on memory blocks selected by the address ADDR. After the word line precharge operation is completed according to the first option OP1, or after only a portion of the word line precharge operation is performed and before the word line precharge operation is completed according to the second option OP2, nonvolatile memory device 110 may switch the signal of the ready/busy signal line R/nB and ready/busy signal pin 5 from the busy state (logical low) to the ready state (logical high).

Referring to a fifth example EX5 of FIG. 12, nonvolatile memory device 110 may receive a fourth precharge command PRE4, the address ADDR, the parameter PAR, and the confirm command CFR through the data lines DQ.

In response to the fourth precharge command PRE4, the address ADDR, the parameter PAR, and the confirm command CFR, nonvolatile memory device 110 may switch a signal of the ready/busy signal line R/nB and ready/busy signal pin 5 from the ready state (logical high) to the busy state (logical low) and may perform the word line precharge operation. Nonvolatile memory device 110 may perform the word line precharge operation on memory blocks selected by the address ADDR. Nonvolatile memory device 110 may perform the word line precharge operation by using information included in the parameter PAR. After the word line precharge operation is completed according to the first option OP1, or after only a portion of the word line precharge operation is performed and before the word line precharge operation is completed according to the second option OP2, nonvolatile memory device 110 may switch the signal of the ready/busy signal line R/nB and ready/busy signal pin 5 from the busy state (logical low) to the ready state (logical high).

Figure 13:
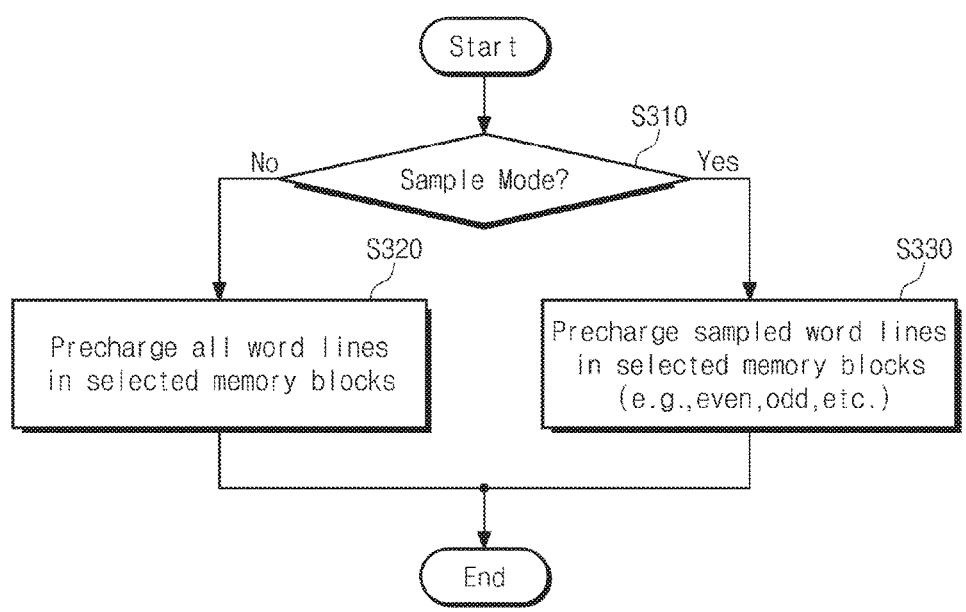
FIG. 13 is a flowchart illustrating an example of modes in which the nonvolatile memory device performs the word line precharge operation.

FIG. 13 is a flowchart illustrating an example of modes in which nonvolatile memory device 110 performs the word line precharge operation. Referring to FIGS. 1, 9, and 13, nonvolatile memory device 110 may operate in a sample mode and a full mode.

In operation S310, nonvolatile memory device 110 may determine whether a mode of nonvolatile memory device 110 is the sample mode or the full mode. For example, a mode of nonvolatile memory device 110 may be determined by the parameter PAR described with reference to FIGS. 11 and 12 or may be determined upon manufacturing nonvolatile memory device 110.

If the mode of nonvolatile memory device 110 is the full mode, the process proceeds to operation S320. In operation S320, nonvolatile memory device 110 may precharge all word lines of selected memory blocks.

If the mode of nonvolatile memory device 110 is the sample mode, the process proceeds to operation S330. In operation S330, nonvolatile memory device 110 may precharge sample word lines of selected memory blocks. For example, the sample word lines may be some but not all word lines of the selected memory blocks, such as odd-numbered word lines or even-numbered word lines.

During a read operation, voltages of floated channels of memory cells may increase by a coupling effect. In the case where hot electron injection or hot carrier injection is suppressed by precharging some but not all word lines, the sample word lines may be precharged.

Figure 14:
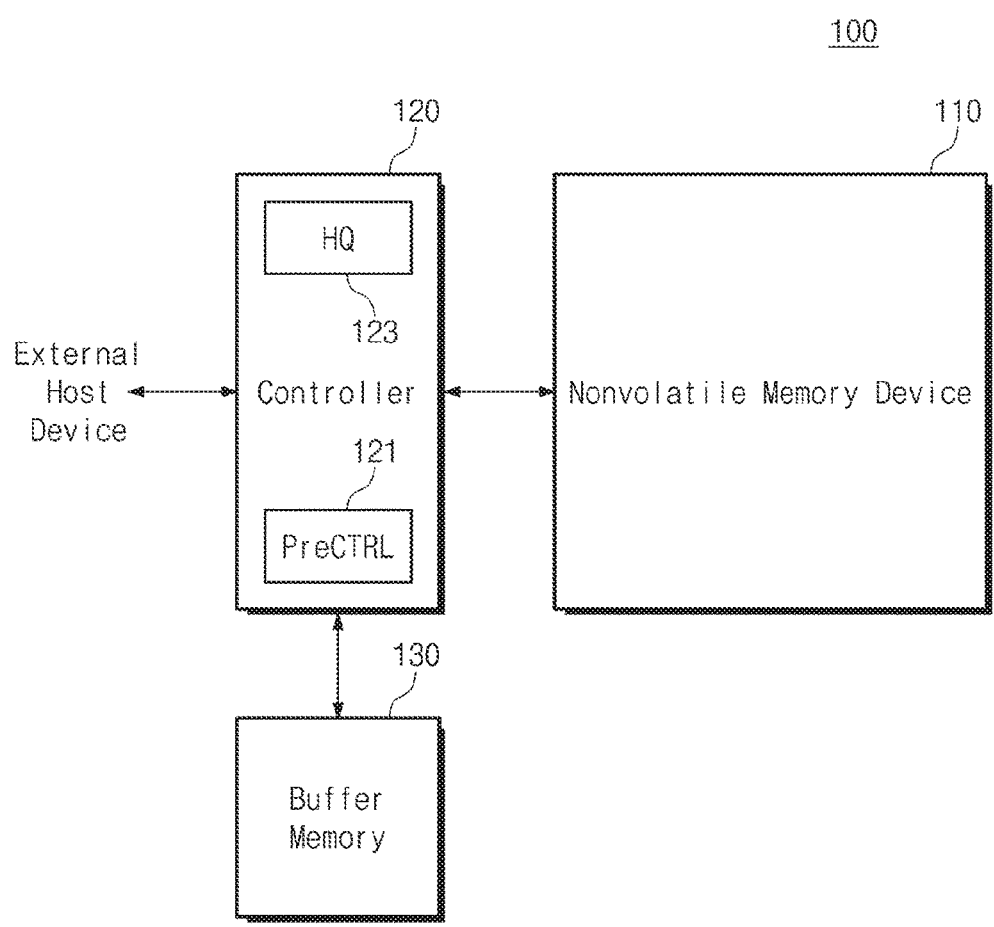
FIG. 14 is a block diagram illustrating an embodiment of a storage device.

FIG. 14 is a block diagram illustrating an embodiment of a storage device 100. Referring to FIG. 14, storage device 100 includes nonvolatile memory device 110, controller 120, and a buffer memory 130.

Nonvolatile memory device 110 may include nonvolatile memory device 110 of FIG. 1 Nonvolatile memory device 110 may include a flash memory, a phase change random access memory (PRAM), a ferroelectric RAM (FeRAM), a magnetic RAM (MRAM), a resistive RAM (RRAM), etc.

Controller 120 may access nonvolatile memory device 110 and buffer memory 130. Controller 120 may perform a program operation, a read operation, and an erase operation in response to a request of an external host device. Controller 120 may store write-requested data in nonvolatile memory device 110 and may read and output read-requested data from nonvolatile memory device 110.

Controller 120 may manage storage device 100 by using buffer memory 130. For example, controller 120 may temporarily store data to be written in nonvolatile memory device 110 or data read from nonvolatile memory device 110 in buffer memory 130. Controller 120 may load metadata, which are needed to manage nonvolatile memory device 110, on buffer memory 130.

Controller 120 may receive a request which is based on a logical address, from the external host device. A flash translation layer (FTL) that is driven in controller 120 may translate a logical address to a physical address of nonvolatile memory device 110. Controller 120 may provide the physical address to nonvolatile memory device 110. Mapping data MD that are needed for translation between a logical address and a physical address may be stored in nonvolatile memory device 110 and may be loaded and used on buffer memory 130. The flash translation layer FTL may perform translation between a logical address and a physical address based on the mapping data MD loaded in buffer memory 130.

Controller 120 includes a precharge control block (PreCTRL) 121. Precharge control block 121 may determine whether to send a precharge command to nonvolatile memory device 110.

Controller 120 further includes a host queue (HQ) 123. Controller 120 may store requests from the external host device in host queue 123 and may sequentially process the stored requests. In the case where no requests are stored in host queue 123, that is, in the case where requests that storage device 100 will process do not exist, controller 120 may determine the case as an idle time or an idle state.

Figure 15:
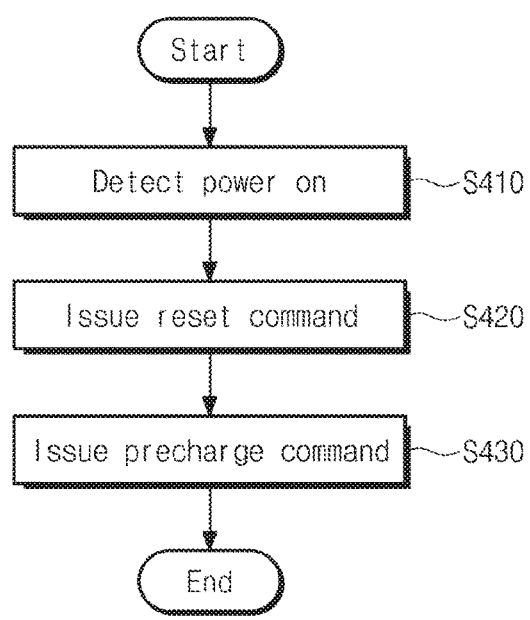
FIG. 15 is a flowchart illustrating an example in which a controller issues a precharge command.

FIG. 15 is a flowchart illustrating an example in which controller 120 issues a precharge command. Referring to FIGS. 14 and 15, in operation S410, controller 120 may detect power on. For example, controller 120 may detect power on based on a voltage change or a signal provided from an external host device. In operation S420, controller 120 may issue a reset command to nonvolatile memory device 110 when the power on is detected. After a reset operation of nonvolatile memory device 110 is completed in response to power on, in operation S430, controller 120 may issue (or send) the precharge command to nonvolatile memory device 110.

In an embodiment, in the case where nonvolatile memory device 110 does not support a function of automatically performing the word line precharge operation in response to the reset command, the method illustrated in FIG. 15 may be more useful.

Figure 16:
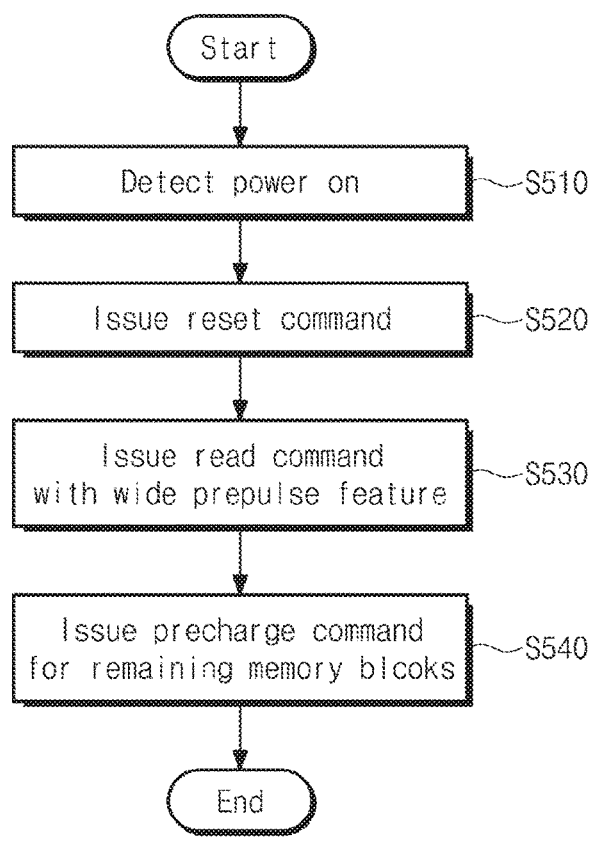

FIG. 16 illustrates another example in which controller 120 issues a precharge command in response to power on. Referring to FIGS. 14 and 15, in operation S510, controller 120 may detect power on. In operation S520, controller 120 may issue a reset command to nonvolatile memory device 110 when the power on is detected. In step S530, controller 120 may issue a read command having a wide prepulse characteristic to nonvolatile memory device 110. In operation S540, controller 120 may issue a precharge command with respect to the remaining memory blocks other than memory blocks associated with the read command.

For example, storage device 100 may be used as a booting drive that stores an operating system. When storage device 100 is used as the booting drive, a plurality of read requests may be provided to storage device 100 at power on. To reduce a booting time, storage device 100 may perform the word line precharge operation after first performing the read requests. For example, controller 120 may process read requests by using read commands having a wide prepulse characteristic, which makes a pulse width of the prepulse PRE (described with reference to FIG. 5 above) wide. If the pulse width of the prepulse PRE increases, as described with reference to FIG. 7, a portion of a voltage increment of a floated channel may be further discharged. Accordingly, hot electron injection or hot carrier injection may be prevented. Accordingly, nonvolatile memory device 110 may be configured to selectively perform a data read operation for nonvolatile memory device 110 after being powered on and before performing the word line precharge operation, depending on a type of data to be read in the data read operation, for example if the data is operating system data or other boot data.

If all read requests associated with the operating system are processed after power on, controller 120 may issue a precharge command for the remaining memory blocks other than memory blocks associated with the read commands.

Figure 17:
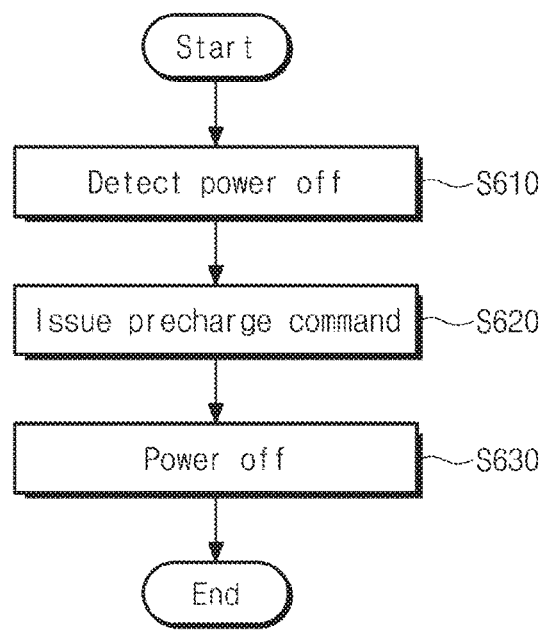
FIG. 17 is a flowchart illustrating another example in which the controller issues the precharge command.

FIG. 17 is a flowchart illustrating another example in which controller 120 issues a precharge command. Referring to FIGS. 14 and 17, in operation S610, controller 120 may detect power off. For example, controller 120 may detect power off based on a voltage change or a signal provided from an external host device. If the power off is detected, it is predicted that word lines are going to be left alone for some period of time. Accordingly, in operation S620, controller 120 may issue a precharge command such that word lines are charged with positive voltages. For example, levels of positive voltages charged to word lines at power off may be higher than levels of positive voltages charged to word lines during a "regular" word line precharge operation. In operation S630, storage device 100 may enter a power off state.

Figure 18:
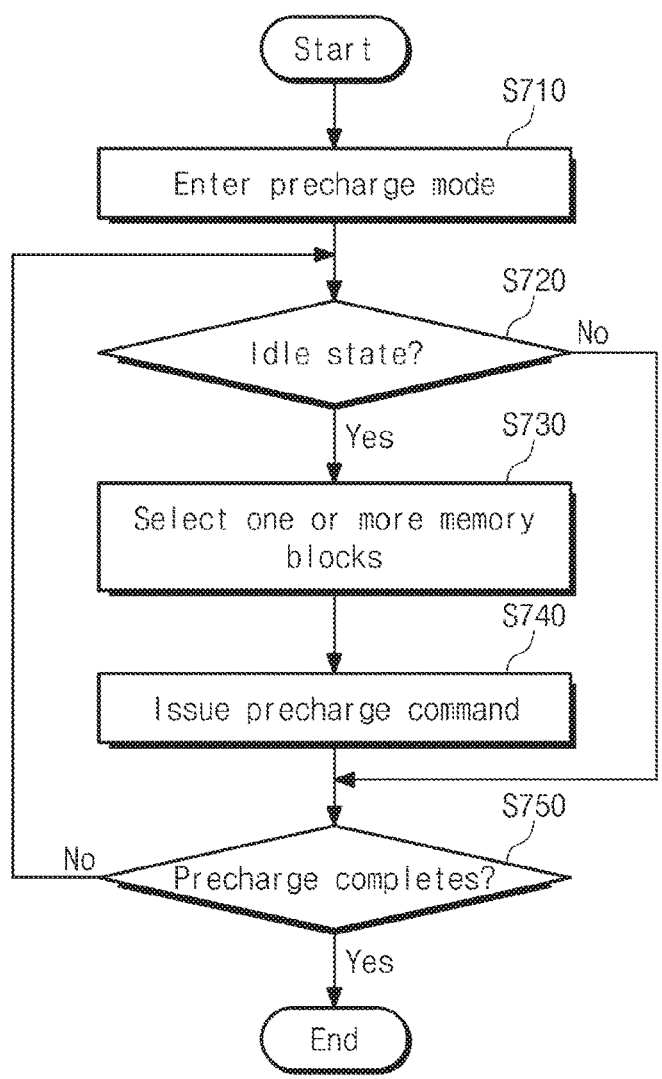
FIG. 18 illustrates an example in which the controller performs a precharge mode.

FIG. 18 illustrates an example in which controller 120 performs a precharge mode. In an embodiment, when controller 120 intends to send a precharge command to nonvolatile memory device 110, controller 120 may send precharge commands by using the precharge mode.

Referring to FIGS. 14 and 18, in operation S710, controller 120 may enter the precharge mode. In operation S720, controller 120 may determine whether a current state is an idle state. If the current state is not an idle state, the process proceeds to operation S750. If the current state is an idle state, the process proceeds to operation S730.

In operation S730, controller 120 may select one or more memory blocks that are some of memory blocks selected as a target of the word line precharge operation. In operation S740, controller 120 may issue a precharge command for the selected memory blocks.

In operation S750, controller 120 may determine whether a precharge operation is completed. For example, controller 120 may determine whether the precharge command is issued with respect to all the memory blocks selected as the target of the word line precharge operation. If the precharge operation is completed, the precharge mode ends. If the precharge operation is not completed, the process returns to operation S720, as described above.

That is, controller 120 may divide the memory blocks selected as the target of the word line precharge operation into two or more sub-groups. Each sub-group may include one or more memory blocks. In an idle state, controller 120 sequentially (or gradually) performs the word line precharge operation in units of a sub-group. When a current state is not an idle state, controller 120 may postpone the word line precharge operation, for example until the next idle state occurs.

In an embodiment, sub-groups may be selected as a target of the word line precharge operation based on priorities. For example, an order of priorities may sequentially decrease in the order of metadata (e.g., firmware data, FTL data, and spare data) needed to manage storage device 100, metadata (e.g., file system data) needed to manage a system including storage device 100, and a memory block storing valid user data.

Figure 19:
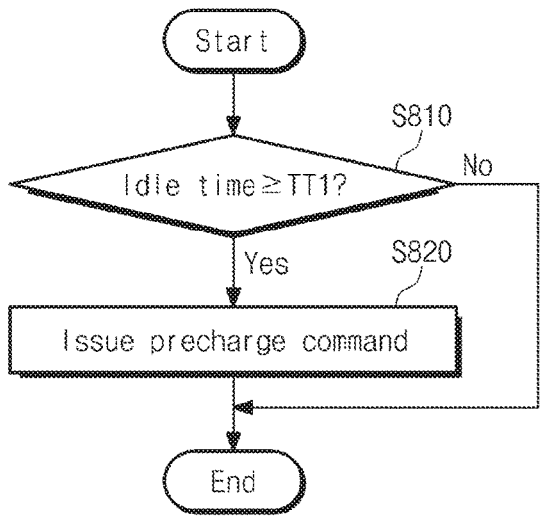
FIG. 19 is a flowchart illustrating an example in which the controller issues the precharge command based on a length of an idle time.

FIG. 19 is a flowchart illustrating an example in which controller 120 issues a precharge command based on the length of an idle time. Referring to FIGS. 14 and 19, in operation S810, controller 120 determines whether or not the length of a continuous idle time is less than a first threshold time TT1. If the length of the continuous idle time is less than the first threshold time TT1, controller 120 may not issue a precharge command. If the length of the continuous idle time is not less than the first threshold time TT1, controller 120 may issue the precharge command.

For example, the idle time may be measured and managed in units of a block group (e.g., each block group includes two or more memory blocks) of the memory blocks BLK1 to BLKz of nonvolatile memory device 110, or in units of a memory block with respect to storage device 100.

Figure 20:
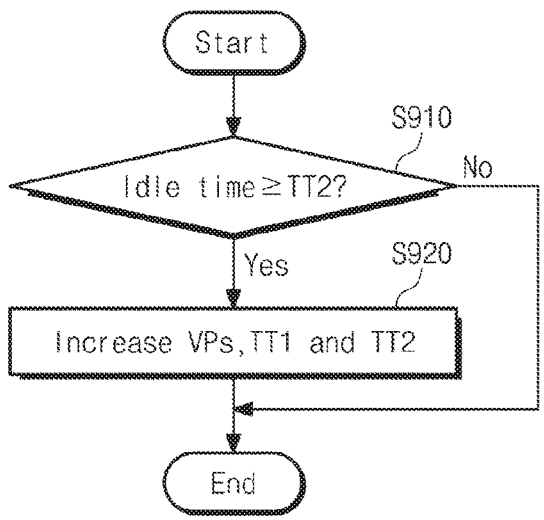
FIG. 20 is a flowchart illustrating another example in which the controller issues the precharge command based on a length of the idle time.

FIG. 20 is a flowchart illustrating another example in which controller 120 issues a precharge command based on the length of an idle time. Referring to FIGS. 14, 19, and 20, in operation S910, controller 120 determines whether the length of a continuous idle time is less than a second threshold time TT2. The second threshold time TT2 may be larger or longer than the first threshold time TT1. If the length of the continuous idle time is less than the second threshold time TT2, controller 120 may maintain precharge parameters associated with the idle time without modification. If the length of the continuous idle time is not less than the second threshold time TT2, controller 120 may change the precharge parameters associated with the idle time. For example, in operation 920, controller 120 may adjust (e.g., increase) levels of positive voltages VPs, the first threshold time TT1, and the second threshold time TT2. For example, controller 120 may change the precharge parameter through the parameter PAR of FIGS. 11 and 12.

For example, as the continuous idle time (i.e., the leaving alone time) increases, word lines may be charged with higher positive voltages (levels of the positive voltages VPs increase), and a period of the word line precharge operation may increase (e.g., the first threshold time TT1 increases). For example, as the continuous idle time (i.e., the leaving alone time) increases, a period to adjust precharge parameters may increase (e.g., the second threshold time TT2 increases). If a program operation, a read operation, or an erase operation is performed on a left-alone memory block, a left-alone block group, or the left-alone storage device 100, precharge parameters of the corresponding memory block, block group or storage device 100 may be reset to initial values. An example in which the precharge parameters are adjusted according to the leaving alone time is described, but embodiments may not be limited thereto.

Figure 21:
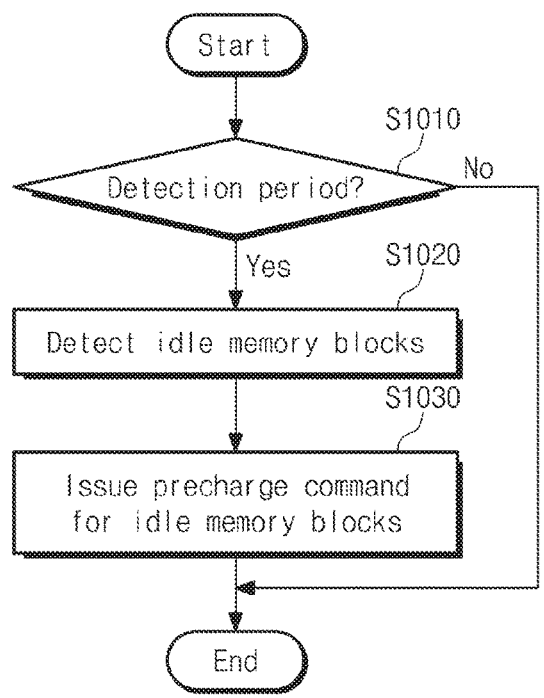
FIG. 21 illustrates an example in which the controller performs a precharge operation periodically.

FIG. 21 illustrates an example in which controller 120 performs a precharge operation periodically. Referring to FIGS. 14 and 21, in operation S1010, controller 120 may determine whether a detection period arrives. For example, if a predetermined period (e.g., a time period or a period of the number of times of accesses) elapses after previous detection, controller 120 may determine that the detection period arrives. If it is determined that the detection period does not arrive, controller 120 may not perform detection. If it is determined that the detection period arrives, the process proceeds to operation S1020.

In operation S1020, controller 120 may detect idle memory blocks. For example, controller 120 may detect memory blocks which are not accessed during the given period, that is, between previous detection and current detection, as idle memory blocks.

In operation S1030, controller 120 may issue a precharge command for the idle memory blocks.

In the above-described embodiments, examples of situations in which the word line precharge operation is performed are described. Unlike the above description or in addition to the above description, the word line precharge operation may be triggered by controller 120 or nonvolatile memory device 110 before or after a specific operation is performed. For example, before and after a program operation, a read operation, or an erase operation, before or after the given number of program operations are performed, before or after the given number of read operations are performed, before or after the given number of erase operations are performed, before or after the given number of access operations (program, read, or erase) are performed, or before or after the first program, read, or erase operation after the given number of access operations (program, read, or erase) are performed, controller 120 may issue word line precharge or nonvolatile memory device 110 may perform the word line precharge operation.

Figure 22:
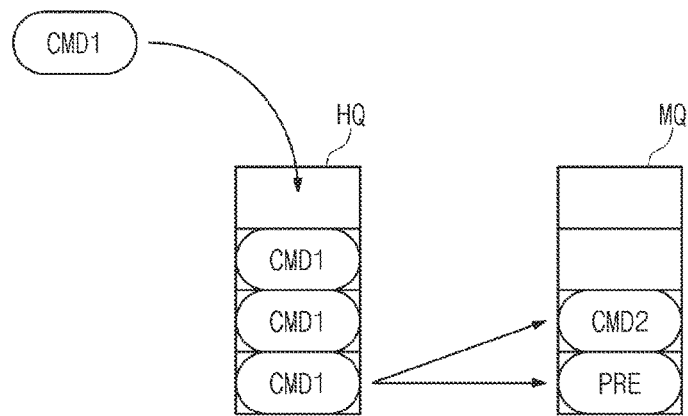
FIG. 22 illustrates an example in which the controller schedules the precharge command together with a command.

FIG. 22 illustrates an example in which controller 120 schedules a precharge command together with a command. Referring to FIGS. 14 and 22, a host command CMD1 may be enqueued in the host queue HQ of controller 120 from an external host device. Controller 120 may decode each host command CMD1 registered in the host queue HQ and may enqueue a memory command CMD2 in a memory queue MQ based on the decoded result. The memory queue MQ may be one of various queues including the host queue HQ provided in controller 120.

A precharge command PRE as well as the memory command CMD2 may be enqueued together in the memory queue MQ based on each host command CMD1 of the host queue HQ. For example, after the precharge command PRE is first enqueued in the memory queue MQ, the memory command CMD2 may be enqueued in the memory queue MQ. Controller 120 may first issue the precharge command PRE to nonvolatile memory device 110 and may then issue the memory command CMD2. Nonvolatile memory device 110 may perform the word line precharge operation in response to the precharge command PRE and may perform an operation corresponding to the memory command CMD2.

For example, a target of the precharge command PRE may be memory blocks belonging to the same group or set as a target memory block of the memory command CMD2. Controller 120 may identify a memory block as a target of a program, read, or erase operation from each host command CMD1 or the memory command CMD2. controller 120 may generate and enqueue the precharge command CMD with respect to memory blocks belonging to the same group or set as a memory block that is a target of the program, read, or erase operation.

For example, the host command CMD1 may be a program, read, or erase command that is defined according to the interface protocol between controller 120 and the external host device. The memory command CMD2 may be a program, read, or erase command that is defined according to the interface protocol between controller 120 and nonvolatile memory device 110.

Figure 23:
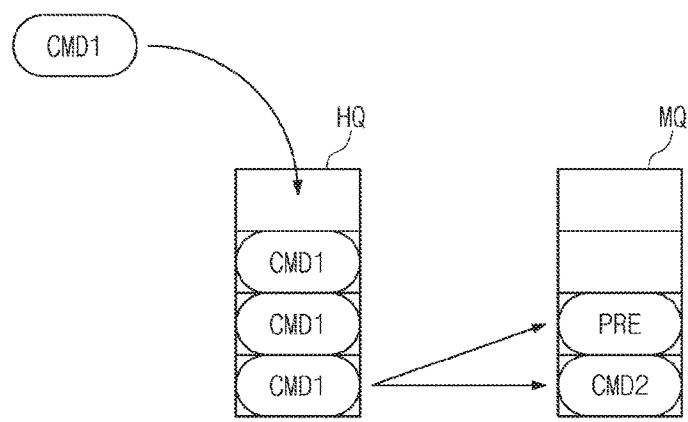
FIG. 23 illustrates another example in which the controller schedules the precharge command together with a command.

FIG. 23 illustrates another example in which controller 120 schedules a precharge command together with a command. Referring to FIG. 23, after the memory command CMD2 is first enqueued in the memory queue MQ, the precharge command PRE may be enqueued. Controller 120 may first issue the memory command CMD2 to nonvolatile memory device 110 and may then issue the precharge command PRE. Nonvolatile memory device 110 may first perform an operation corresponding to the memory command CMD2 and may then perform the word line precharge operation in response to the precharge command PRE.

In an embodiment, various information associated with the word line precharge operation may be set in nonvolatile memory device 110 by a fuse option which may be set, for example, during manufacturing of nonvolatile memory device 110, or may be provided from controller 120 to nonvolatile memory device 110. For example, a kind or level of a positive voltage for precharging a word line, temperature variation information, time information, block group information, activation information, bad block management information, ramping information, etc. may be set in nonvolatile memory device 110 by the fuse option, or may be provided from controller 120 to nonvolatile memory device 110.

The kind or level of the positive voltage may include information about whether to use an external power supply voltage, an internal power supply voltage, or any voltage as the positive voltage and a level of any voltage. The temperature variation information may include whether to vary a level of the positive voltage based on a peripheral temperature and how much the level of the positive voltage is adjusted according to a temperature. The time information may include the maximum time or minimum time to be allocated for the word line precharge operation or the maximum time or minimum time corresponding to a situation (e.g., before or after a read or an erase operation, after power-on, or before power-off) in which the word line precharge operation is performed. The block group information may include whether to perform the word line precharge operation while being divided into partial groups and the number of memory blocks included in each partial group. The activation information may include whether to activate the word line precharge operation. The bad block management information may include whether to exclude a bad block from a target of the word line precharge operation with reference to a bad block management system during the word line precharge operation. The ramping information may include whether to stepwise increase a positive voltage through ramping during the word line precharge operation, an increment of a voltage of each step, and duration of a voltage of each step.

In the above-described embodiments, components according to embodiments are referred to by using the term "block". The "block" may be implemented with various hardware devices, such as an integrated circuit, an application specific IC (ASIC), a field programmable gate array (FPGA), and a complex programmable logic device (CPLD), software, such as firmware and applications driven in hardware devices, or a combination of a hardware device and software.

According to embodiments, it may be possible to prevent data written in memory cells from being damaged or lost upon performing a read operation on memory cells that are left alone for a long time. Accordingly, a nonvolatile memory device with improved reliability, an operating method of the nonvolatile memory device, and a storage device including the nonvolatile memory device may be provided.

What is claimed is:

1. A nonvolatile memory device, comprising:
a memory cell array including a plurality of nonvolatile memory cells configured to store data therein, wherein each of the nonvolatile memory cells is connected to one of a plurality of word lines and one of a plurality of bit lines of the memory cell array;
a row decoder connected to the word lines and configured to selectively apply at least one word line voltage to at least one of the word lines;
a page buffer connected to the plurality of bit lines; and
a ready/busy signal pin,
wherein the nonvolatile memory device is configured to perform a word line precharge operation by:
causing the ready/busy signal pin to indicate that the nonvolatile memory device is in a precharge busy state wherein the nonvolatile memory device is not available to perform memory access operations for the nonvolatile memory cells;
applying one or more word line precharge voltages to one or more selected word lines among the plurality of word lines to precharge the selected word lines; and
after at least a portion of the word line precharge operation, causing the ready/busy signal pin to transition from indicating the precharge busy state, to indicating that the nonvolatile memory device is in a ready state wherein the nonvolatile memory device is available to perform memory access operations for the nonvolatile memory cells.

2. The device of claim 1, wherein during the word line precharge operation the plurality of bit lines are floating or connected to a fixed voltage, and data stored in the nonvolatile memory cells which are connected to the selected word lines remains unchanged.

3. The nonvolatile memory device of claim 1, wherein the selected word lines include all of the word lines of the memory cell array.

4. The nonvolatile memory device of claim 1, wherein the selected word lines are less than all of the word lines of a memory block of the memory cell array.

5. The nonvolatile memory device of claim 1, wherein the nonvolatile memory device is configured to perform the word line precharge operation in response to a Reset command received from a memory controller.

6. The nonvolatile memory device of claim 1, wherein the nonvolatile memory device is configured to perform the word line precharge operation in response to each time that the nonvolatile memory device is powered on.

7. The nonvolatile memory device of claim 1, wherein the nonvolatile memory device is configured to perform the word line precharge operation in response to a Precharge command received from a memory controller, wherein the Precharge command specifically instructs the nonvolatile memory device to perform the word line precharge operation.

8. A nonvolatile memory system, comprising:
a nonvolatile memory device having a memory cell array including a plurality of nonvolatile memory cells configured to store data therein, wherein each of the nonvolatile memory cells is connected to one of a plurality of word lines and one of a plurality of bit lines of the memory cell array, wherein the nonvolatile memory device includes a ready/busy signal pin; and
a memory controller configured to control operations of the nonvolatile memory device,
wherein the nonvolatile memory system is configured to perform a word line precharge operation by:
causing the ready/busy signal pin to indicate that the nonvolatile memory device is in a precharge busy state wherein the nonvolatile memory device is not available to perform memory access operations for the nonvolatile memory cells;
applying one or more word line precharge voltages to one or more selected word lines among the plurality of word lines to precharge the selected word lines; and
after at least a portion of the word line precharge operation, cause the ready/busy signal pin to transition from indicating the precharge busy state, to indicating that the nonvolatile memory device is in a ready state wherein the nonvolatile memory device is available to perform memory access operations for the nonvolatile memory cells.

9. The nonvolatile memory system of claim 8, wherein during the word line precharge operation the plurality of bit lines are floating or connected to a fixed voltage, and data stored in the nonvolatile memory cells which are connected to the selected word lines remains unchanged.

10. The nonvolatile memory system of claim 8, wherein the nonvolatile memory system is configured to perform the word line precharge operation in response to each time that the memory system is powered off, wherein the word line precharge operation is performed prior to powering off.

11. The nonvolatile memory system of claim 8, wherein the memory controller is configured to provide a Precharge command to the nonvolatile memory device, wherein the Precharge command specifically instructs the nonvolatile memory device to perform the word line precharge operation, and wherein the nonvolatile memory device is configured to perform the word line precharge operation in response to the Precharge command.

12. The nonvolatile memory system of claim 11, wherein the memory controller is configured to provide the Precharge command to the nonvolatile memory device whenever an idle time of the nonvolatile memory device exceeds a threshold.

13. A method of performing a precharge operation for a nonvolatile memory device having a memory cell array including a plurality of nonvolatile memory cells configured to store data therein, wherein each of the nonvolatile memory cells is connected to one of a plurality of word lines and one of a plurality of bit lines of the memory cell array, the method comprising:
causing a ready/busy signal pin of the nonvolatile memory device to indicate that the nonvolatile memory device is in a precharge busy state wherein the nonvolatile memory device is not available to perform memory access operations for the nonvolatile memory cells;
applying one or more word line precharge voltages to one or more selected word lines among the plurality of word lines to precharge the selected word lines; and
after at least a portion of the precharge operation, causing the ready/busy signal pin to transition from indicating the precharge busy state, to indicating that the nonvolatile memory device is in a ready state wherein the nonvolatile memory device is available to perform memory access operations for the nonvolatile memory cells.

14. The method of claim 13, wherein the selected word lines include all of the word lines of at least one selected memory block of the memory cell array.

15. The method of claim 13, further comprising the nonvolatile memory device receiving a Precharge command, wherein the Precharge command specifically instructs the nonvolatile memory device to perform the precharge operation.

16. The method of claim 15, further comprising the nonvolatile memory device receiving one or more parameters for the precharge operation.

17. The method of claim 16, wherein the one or more parameters include at least one of: a mode of the precharge operation to be performed by the nonvolatile memory device, and one or more voltage levels to be employed as the word line precharge voltages.

18. The method of claim 15, further comprising a memory controller sending the Precharge command to the nonvolatile memory device.

19. The method of claim 18, further comprising:
the memory controller receiving a data read request from a host device to read data from the nonvolatile memory device; and
the memory controller sending the Precharge command to the nonvolatile memory device in response to the data read request.

\* \* \* \* \*